(12) United States Patent
Lies

(10) Patent No.: US 12,743,251 B2
(45) Date of Patent: Sep. 22, 2026

(54) FLOATING POINT FUSED MULTIPLY ADD WITH MERGED 2'S COMPLEMENT AND ROUNDING

(71) Applicant: TEXAS INSTRUMENTS INCORPORATED, Dallas, TX (US)

(72) Inventor: Garrett Joseph Lies, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1196 days.

(21) Appl. No.: 17/566,353

(22) Filed: Dec. 30, 2021

(65) Prior Publication Data

US 2023/0214179 A1 Jul. 6, 2023

(51) Int. Cl.

| | |
|---|---|
| ***G06F 7/499*** | (2006.01) |
| ***G06F 7/483*** | (2006.01) |
| ***H03K 19/20*** | (2006.01) |

(52) U.S. Cl.

CPC .......... *G06F 7/49915* (2013.01); *G06F 7/483* (2013.01); *G06F 7/49947* (2013.01); *G06F 7/49957* (2013.01); *G06F 7/49963* (2013.01); *G06F 7/49968* (2013.01); *H03K 19/20* (2013.01)

(58) Field of Classification Search

CPC ................ G06F 7/483; G06F 7/49915; G06F 7/49947–49984; H03K 19/20

See application file for complete search history.

(56) References Cited

U.S. PATENT DOCUMENTS

| | | | | |
|---|---|---|---|---|
| 5,892,698 | A * | 4/1999 | Naffziger | G06F 7/5443 708/501 |
| 8,606,840 | B2 * | 12/2013 | Ahmed | G06F 7/483 708/523 |
| 2010/0146023 | A1 * | 6/2010 | Boersma | G06F 5/01 708/205 |
| 2017/0293470 | A1 * | 10/2017 | Wang | G06F 7/5443 |

OTHER PUBLICATIONS

"IEEE Standard for Floating-Point Arithmetic," in IEEE Std 754-2019 (Revision of IEEE 754-2008) , pp. 1-10,26-47,77-84, Jul. 22, 2019, doi: 10.1109/IEEESTD.2019.8766229. (Year: 2019).*

L. Huang, L. Shen, K. Dai and Z. Wang, "A New Architecture For Multiple-Precision Floating-Point Multiply-Add Fused Unit Design," 18th IEEE Symposium on Computer Arithmetic (ARITH '07), Montpellier, France, 2007, pp. 69-76, doi: 10.1109/ARITH.2007.5. (Year: 2007).*

* cited by examiner

*Primary Examiner* — Andrew Caldwell
*Assistant Examiner* — Kenny K. Bui
(74) *Attorney, Agent, or Firm* — Michael T. Gabrik; Frank D. Cimino

(57) ABSTRACT

A method includes receiving an unrounded mantissa value and a round bit associated with the unrounded mantissa value. The method also includes receiving a 2's complement signal that indicates whether the unrounded mantissa value results from a 1's complement operation. The method includes incrementing the unrounded mantissa value to provide an incremented value. The unrounded mantissa value is a non-incremented value. The method further includes providing one of the incremented value or non-incremented value as a rounded mantissa value responsive to the 2's complement signal.

18 Claims, 14 Drawing Sheets

DP_out
SUM[126:0]
SELECTED 23-BIT OUTPUT
SELECTED 12-BIT OUTPUT
53-BIT UNROUNDED MANTISSA RESULT
ROUND BIT
LEADING BIT
53-BIT UNROUNDED MANTISSA
ROUND SP1_out
SUM[126:64]
SELECTED 23-BIT OUTPUT
24-BIT UNROUNDED MANTISSA RESULT
ROUND BIT
LEADING BIT
24-BIT UNROUNDED MANTISSA
ROUND

FLOATING POINT FUSED MULTIPLY ADD WITH MERGED 2'S COMPLEMENT AND ROUNDING

SUMMARY

In accordance with at least one example of the disclosure, a method includes receiving an unrounded mantissa value and a round bit associated with the unrounded mantissa value. The method also includes receiving a 2's complement signal that indicates whether the unrounded mantissa value results from a 1's complement operation. The method includes incrementing the unrounded mantissa value to provide an incremented value. The unrounded mantissa value is a non-incremented value. The method further includes providing one of the incremented value or non-incremented value as a rounded mantissa value responsive to the 2's complement signal.

In accordance with another example of the disclosure, a device includes an incrementor configured to receive an unrounded mantissa value, and to increment the unrounded mantissa value to provide an incremented value, in which the unrounded mantissa value is a non-incremented value. The device also includes a rounding select circuit configured to receive a round bit associated with the unrounded mantissa value; receive a 2's complement signal that indicates whether the unrounded mantissa value results from a 1's complement operation; and provide a rounding output responsive to the 2's complement signal. The device also includes a multiplexor (mux) coupled to the incrementor and the rounding select circuit, in which the mux is configured to receive the incremented value and the non-incremented value as inputs; receive the rounding output as a control signal; and provide one of the incremented value or non-incremented value as a rounded mantissa value responsive to the rounding output.

In accordance with yet another example of the disclosure, a system includes a normalizer configured to receive an unnormalized, unrounded mantissa value; provide, responsive to the unnormalized, unrounded mantissa value, a normalized, unrounded mantissa value and a round bit; provide a sticky bit that comprises an OR reduction of bits in the unnormalized, unrounded mantissa value that are less-significant than the round bit; and provide a ones bit that comprises an AND reduction of bits in the unnormalized, unrounded mantissa value that are less-significant than the round bit. The system also includes a rounding unit coupled to the normalizer, in which the rounding unit includes an incrementor configured to increment the normalized, unrounded mantissa value to provide an incremented value, in which the normalized, unrounded mantissa value is a non-incremented value. The rounding unit also includes a rounding select circuit configured to receive the round bit; receive a 2's complement signal that indicates whether the unrounded mantissa value results from a 1's complement operation; and provide a rounding output responsive to the 2's complement signal. The rounding unit further includes a multiplexor (mux) coupled to the incrementor and the rounding select circuit, in which the mux is configured to receive the incremented value and the non-incremented value as inputs; receive the rounding output as a control signal; and provide one of the incremented value or non-incremented value as a rounded mantissa value responsive to the rounding output.

BRIEF DESCRIPTION OF THE DRAWINGS

For a detailed description of various examples, reference will now be made to the accompanying drawings in which.

DETAILED DESCRIPTION

Processors can be configured to perform arithmetic operations on floating point numbers. In floating point representation, numbers are represented by a mantissa 1.F, an exponent E, and a sign bit S. The mantissa 1.F represents the significant digits of the floating point number and the exponent E represents the position of the binary point (e.g., radix point) relative to the mantissa. The sign bit S, if used, indicates whether the floating point number is positive (e.g., sign bit S equal to 0) or negative (e.g., sign bit S equal to 1). A floating point arithmetic operation can generate a result with more significant bits than the number of bits available for the mantissa. Accordingly, such a result is rounded (e.g., to a number of significant bits that can be represented using the available number of mantissa bits).

In some cases, a processor uses a fused multiply-add (FMA) operation to improve floating point arithmetic processing. The FMA operation combines a floating point multiplication operation and a floating point addition operation for execution as a single instruction. The FMA operation generates a result equal to (A*B)+C, with a single rounding step. By performing the two operations in a single instruction, the FMA operation reduces execution time and increases throughput. The FMA operation also improves precision because it uses a single rounding step instead of two rounding steps (e.g., a first rounding step for a multiplication operation and a second rounding step for the subsequent addition operation). Accordingly, it is useful to improve the efficiency and/or performance of FMA operations.

Figure 1:
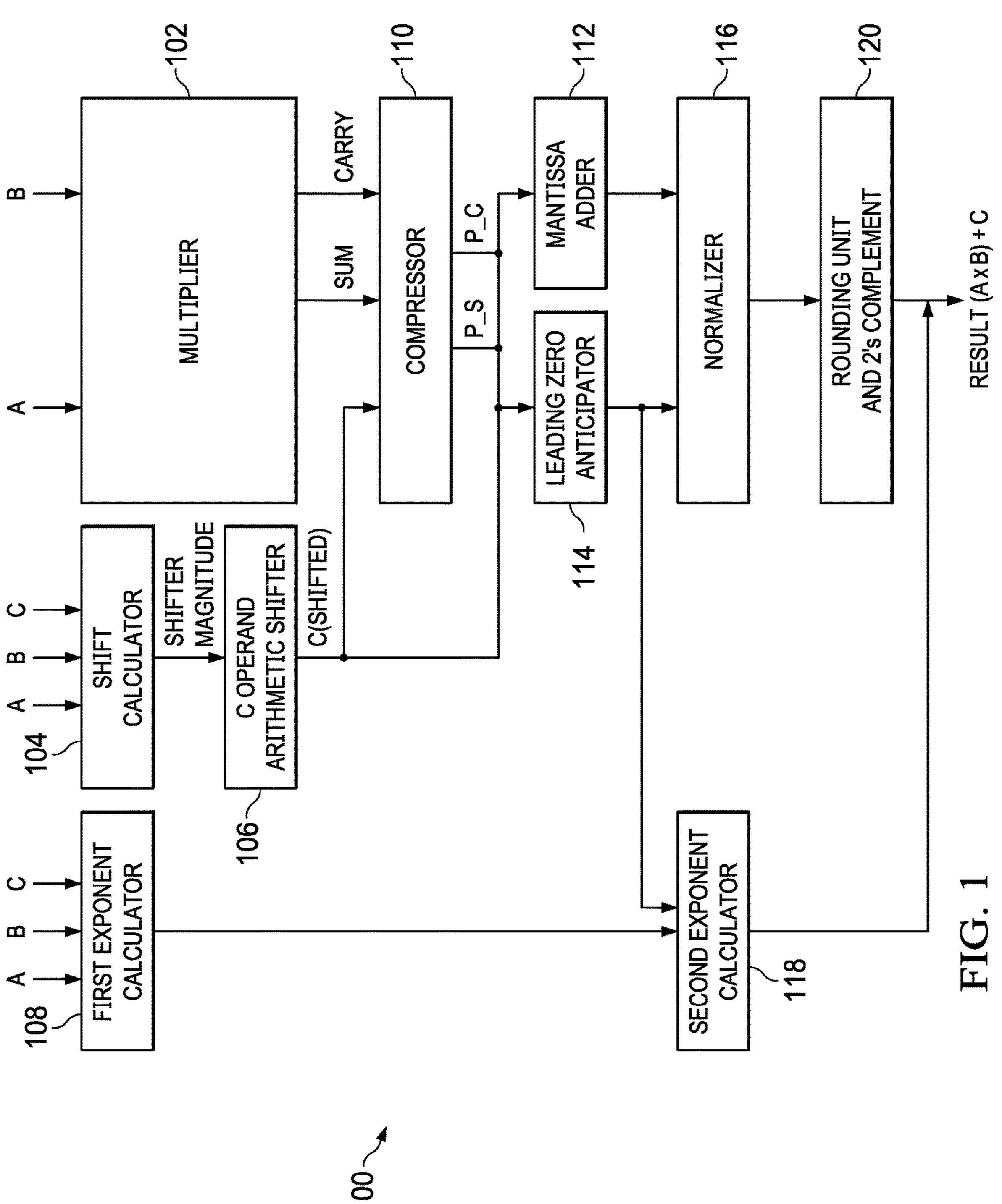
FIG. 1 is a schematic block diagram of a fused multiply-add (FMA) unit in accordance with various examples.

FIG. 1 is a schematic block diagram of a FMA unit 100, which is a hardware functional unit of a processor in some examples, that is configured to implement a FMA operation on floating point operands A, B, and C to provide a floating point result equal to (A*B)+C. The FMA unit 100 is configured to operate both on single precision (SP) floating point values and on double precision (DP) floating point values. For example, a SP floating point value includes a 76-bit mantissa and a DP floating point value includes a 163-bit mantissa. In one example, the FMA unit 100 is configured to operate on dual SP floating points values; that is, the FMA unit 100 is configured to perform FMA operations on two sets of SP operands in parallel.

Regardless of whether the FMA unit 100 operates on SP or DP floating point values, the FMA unit 100 includes a multiplier 102 that is configured to multiply the A and B operands and to provide a result in carry-sum format. For example, the result provided by the multiplier 102 includes a sum value (SUM) and a carry value (CARRY).

The FMA unit 100 also includes a shift calculator 104 and a shifter 106 that are configured to align the C operand based on the exponent difference of A, B, and C. For example, addition of the C operand to the product of A*B is performed responsive to alignment of the mantissas of the C operand and the product A*B so that their exponents are the same. The shift calculator 104 is configured to receive the exponent portions of A, B, and C to determine a magnitude of shifting to align the C operand with the product of A*B. The shift calculator 104 provides the magnitude to the shifter 106, which performs an arithmetic right shift on the C operand responsive to the magnitude received from the shift calculator 104. The shifter 106 is configured to provide a shifted C operand (e.g., the C operand shifted by the magnitude received from the shift calculator 104) as its output. In this example, the shift calculator 104 and the shifter 106 align the C operand in parallel with the multiplier 102 determining the product A*B.

The FMA unit 100 also includes a first exponent calculator 108. The first exponent calculator 108 is configured to receive the exponent portions of A, B, and C and to determine the larger of the exponent of C or the exponent of the product A*B. The first exponent calculator 108 is configured to provide the larger of the two exponents as its output.

The FMA unit 100 includes a compressor 110, which is configured to receive the sum of the shifted C operand and the carry-sum formatted product of A*B, and to compress the overlapped result of the alignment (e.g., the shifted C operand) with the carry and sum results of the carry-sum formatted product of A*B. This reduces the number of inputs to a subsequent addition unit (e.g., mantissa adder 112) from three to two. The compressor 110 provides a carry-sum formatted compressed output, the sum portion of which is labeled P_S and the carry portion of which is labeled P_C.

The FMA unit 100 includes a mantissa adder 112, which receives the carry-sum formatted compressed output from the compressor 110. The mantissa adder 112 also receives a non-overlapped portion of shifted C operand, and provides an output that is a sum of the shifted C operand and the A*B mantissa result. For example, the alignment of the C operand performed by the shifter 106 results in a 163-bit vector, while the A*B result is a 106-bit vector. The compressor 110 reduces its three inputs to two outputs that correspond to the overlapping portions of the three inputs (e.g., where C aligns with A*B in carry-sum format). Accordingly, the shifted C operand is also provided to the mantissa adder 112 because the non-overlapping bits of the shifted C operand have not been reflected in the output of the compressor 110, but should be part of the addition operation implemented by the mantissa adder 112.

As described below, in some examples the mantissa adder 112 includes a carry propagate adder (e.g., a 128-bit carry propagate adder). However, in an example in which the mantissa is a 163-bit value, the entire 163-bit result vector cannot fit into the 128-bit carry propagate adder, and thus the mantissa adder 112 also includes an increment circuit. For dual SP FMA operations, two increment circuits (e.g., one increment circuit for each SP operation) are used to determine the upper bits of the result. For DP FMA operations, both increment circuits are combined to determine the upper bits of the result. For SP and DP FMA operations, the lower bits of the result(s) are determined by the carry propagate adder. In some examples, the mantissa adder 112 is also configured to produce a 1's complement output (e.g., sum) to facilitate a subsequent 2's complement operation so that the result of the FMA operation is in 2's complement format. For example, because floating point format includes a sign bit separate from the mantissa, a mantissa is represented as a positive number even if the result that produced that mantissa is negative (e.g., the sign bit represents the negative aspect of the result, while the mantissa is represented as a positive number). Accordingly, the mantissa of a negative result of the FMA operation is 2's complemented (e.g., by rounding unit 120, described below) to produce a mantissa having a positive value, and the negative nature of the result is reflected in the sign bit of the floating point result of the FMA operation.

The FMA unit 100 also includes a leading zero anticipator (LZA) 114, which can be provided in parallel with the mantissa adder 112. In some examples, the result of the mantissa adder 112 is normalized before it is rounded, because the position of the round bit is unknown so far. Accordingly, the LZA 114 also receives the same inputs as the mantissa adder 112 and determines the position of the most-significant bit (MSB) of the result. For example, the LZA 114 is configured to encode the carry and sum bits into an anticipation result, which is provided to a leading zero detector (LZD) to determine the position of the first '1' in the anticipation result. The result of the LZD, and thus the LZA 114, is a shift left amount that can be used to normalize the result of the FMA operation prior to rounding.

The FMA unit 100 includes a normalizer 116, which is configured to receive the shift left amount from the LZA 114 and the sum result from the mantissa adder 112. The normalizer 116 is configured to normalize the sum result responsive to the shift left amount, and to provide the normalized result to a rounding unit 120. The rounding unit 120 is configured to round the normalized result to obtain the final mantissa of the FMA operation. As described, rounding is performed so that the result of a FMA operation can conform to a particular data format having a certain, finite number of bits. As described briefly above and in more detail below, the rounding unit 120 can also be configured to complete a 2's complement on the 1's complement result (e.g., by incrementing) from the mantissa adder 112, so that the mantissa of the result of the FMA operation is in 2's complement format if necessary (e.g., where the result is a negative value, which is reflected by the sign bit and a positive mantissa as described above). A second exponent calculator 118 is configured to receive the selected exponent from the first exponent calculator 108, and to receive the shift left amount from the LZA 114. The second exponent calculator 118 is configured to determine the final exponent of the FMA operation by subtracting the shift left amount from the previous exponent result.

As described above, it is useful to improve the efficiency and/or performance of FMA operations. Accordingly, examples of this description include such improvements to the FMA unit 100 and, more particularly, to the mantissa adder 112. In the following examples, reference is made at times to various values having specific numbers of bits, for ease of explanation and/or to demonstrate various circuit functionality. However, the scope of this description is not limited to values having such specific numbers of bits unless explicitly stated. Further, in the following examples, reference is made to certain arrangements of logic gates and/or implementations of logical functions. However, such logical functions can be implemented differently in other examples (e.g., using different logic gates and/or combinations of logic gates), and the scope of this description is not limited to specific arrangements of logic gates unless explicitly stated.

Figure 2:
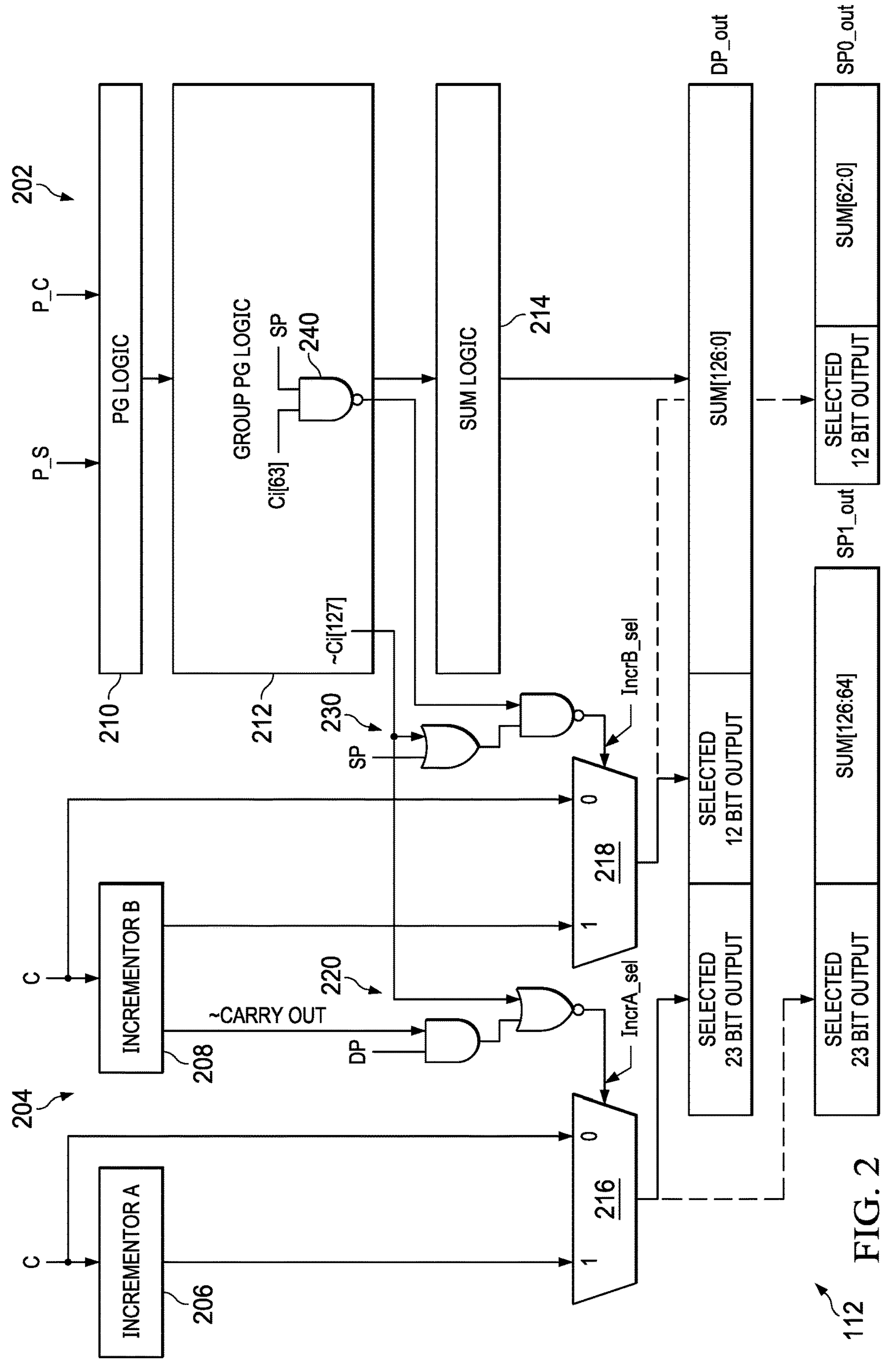
FIG. 2 is a schematic block diagram of a mantissa adder of the FMA unit of FIG. 1 in accordance with various examples.

FIG. 2 is a schematic block diagram of the mantissa adder 112 in one example. In this example, the mantissa adder 112 is configured to perform either two SP floating point addition operations in parallel, or a DP floating point addition operation. A 163-bit mantissa result is provided for the DP floating point addition operation (e.g., DP_out), while a 76-bit mantissa result is provided for SP floating point addition operations (or two 76-bit mantissa results for dual SP floating point addition operations, such as SP1_out and SP0_out), such as to comply with IEEE floating point arithmetic and rounding standards. In the example of FIG. 2, the result DP_out is only shown as a 162-bit value because the sign bit is omitted in this figure; similarly, the result SP0_out is only shown as a 75-bit value because the sign bit is omitted in this figure. SP1_out is greater than 76 bits, and accordingly certain more-significant bits of SP1_out can be discarded or otherwise ignored by subsequent blocks in the FMA unit 100. The mantissa adder 112 receives the carry-sum formatted compressed output (e.g., labeled P_S and P_C to reflect the outputs of the compressor 110, described above), which reflects the carry-sum formatted product of A*B and the portion of the C operand that overlaps, or is aligned with, the A*B result. The mantissa adder 112 also receives the non-overlapped shifted C operand bits (e.g., labeled C for simplicity), and provides an output that is a sum of the shifted C operand and the carry-sum formatted compressed output.

For both DP and SP floating point addition operations in the context of the FMA unit 100, an upper portion of the addition can be handled by an incrementor circuit because only the shifted C operand (e.g., a non-overlapped value) exists as an input to the mantissa adder 112 in this upper bit range. The upper portion is a more-significant portion of the mantissa adder 112. For example, in a DP floating point addition operation, the upper 55 bits of the mantissa could be computed using an incrementor circuit, while in a SP floating point addition operation, the upper 26 bits of each of two mantissas could be computed using an incrementor circuit. However, in the specific example of FIG. 2, a 128-bit addition unit 202 is provided. Accordingly, for the DP floating point addition operation, the lower 127 bits are determined using the addition unit 202, while the remaining 35 bits are determined using an incrementor circuit 204. As described above, the output labeled DP_out is shown as including 162 bits because the sign bit has been omitted. Similarly, for the SP floating point addition operation, the lower 63 bits of each of two mantissas are determined using the addition unit 202 (e.g., bits 0 through 62 and bits 64 through 126, respectively), while the remaining 12 bits are determined using the incrementor circuit 204. The addition unit 202 thus handles a less-significant portion of the mantissa adder 112. As described above, the output labeled SP0_out is shown as including 75 bits because the sign bit has been omitted.

The incrementor circuit 204 is thus partitioned into a first, 23-bit incrementor circuit 206 (e.g., incrementor A 206) and a second, 12-bit incrementor circuit 208 (e.g., incrementor B 208). The full 35-bit incrementor circuit 204 is used for the DP floating point addition operation, while incrementor A 206 is used for a first SP floating point addition operation and incrementor B 208 is used for a second SP floating point addition operation.

In this example, the addition unit 202 is implemented as a tree adder, which is a relatively higher performance adder architecture. The addition unit 202 performs addition using one level of propagate-generate (PG) logic 210, log(n) levels of group PG logic 212 (e.g., where n is 128 in this example), and one level of sum logic 214. Although not shown in FIG. 2 for simplicity, the mantissa adder 112 computes a partial sum of each of the lower 128 bits by performing an exclusive or (XOR) operation on the input bits for each bit position. For example, a partial sum is computed for bit position 0 by performing P_C[0]^P_S[0], and so on for the other bit positions of the addition unit 202.

The PG logic 210 and group PG logic 212 are configured to compute a carry value for each bit position, and the sum logic 214 is configured to combine the carry value and the partial sum for each bit position to provide a result of the addition unit 202.

The PG logic 210 provides the propagate and generate values for each bit position of the addition unit 202. The generate signal is asserted when, regardless of the carry in value, a carry out will be generated. Accordingly, the generate signal is asserted responsive to both inputs for that bit position being asserted. The propagate signal is asserted when a carry in for that bit position will propagate to the next bit position. Accordingly, the propagate signal is asserted responsive to one of the inputs for that bit position being asserted and the other input for that bit position being de-asserted. In some examples, a kill signal is asserted when a carry out will not be produced regardless of the carry in value. Accordingly, the kill signal is asserted responsive to both inputs for that bit position being de-asserted.

The generate signal can be provided as the output of an AND gate that receives the two input bits for that bit position as its input. The propagate signal can be provided as the output of an XOR gate that receives the two input bits for that bit position as its input. The propagate signal can also be provided as the output of an OR gate, because the propagate signal has no effect on the output when the corresponding generate signal is asserted. The kill signal can be provided as the output of a NOR gate that receives the two input bits for that bit position as its input. In some examples, inverted generate and/or propagate signals can be used in the PG logic 210 because NAND and NOR gates are often faster than AND and OR gates.

The group PG logic 212 can be implemented using different architecture depending on the particular tree adder structure being implemented. In one example, the group PG logic 212 is implemented using a Sklansky adder architecture. Irrespective of the particular architecture of the group PG logic 212, each level in the group PG logic 212 is configured to receive the propagate and generate values from either the PG logic 210 (e.g., the first level of group PG logic 212) or from a previous level of the group PG logic 212. For example, the second level of group PG logic 212 receives propagate and generate signals from the first level of group PG logic 212. The group PG logic 212 provides the carry out signal for each bit position of the addition unit 202.

The sum logic 214 receives the carry out signals for each bit position of the addition unit 202 from the group PG logic 212. The sum logic 214 also receives the partial sum (e.g., P_CˆP_S) described above. The sum logic 214 is configured to compute the final sum for the addition unit 202 by XORing the partial sum with the carry in signal (e.g., the carry out signal from a preceding, numerically lower, bit position) for each bit position. In an example, the final sum for the addition unit 202 is also referred to as an intermediate sum, because it is subsequently concatenated with the result(s) of the incrementors 206, 208 to produce the output(s) of the mantissa adder 112.

The incrementors 206, 208 are configured to provide an incremented sum of their input bits (e.g., the upper bits of the shifted C operand for a DP FMA operation, or the upper bits of each of the shifted C operands for SP FMA operations in parallel).

A first multiplexor (mux) 216 has a first input configured to receive the input bits for incrementor A 206, and a second input configured to receive the output bits from incrementor A 206. The first mux 216 is configured to receive a control signal. The first mux 216 is configured to provide the input bits for incrementor A 206 as the first mux 216 output responsive to the control signal being '0', and to provide the output bits from incrementor A 206 as the first mux 216 output responsive to the control signal being '1'.

A second mux 218 has a first input configured to receive the input bits for incrementor B 208, and a second input configured to receive the output bits from incrementor B 208. The second mux 218 is configured to receive a control signal. The second mux 218 is configured to provide the input bits for incrementor B 208 as the second mux 218 output responsive to the control signal being '0', and to provide the output bits from incrementor B 208 as the second mux 218 output responsive to the control signal being '1'.

Accordingly, the first mux 216 and the incrementor A 206 function to compute both an incremented sum and a non-incremented sum, one of which is selected responsive to a carry out bit from the addition unit 202. Similarly, the second mux 218 and the incrementor B 208 function to compute both an incremented sum and a non-incremented sum, one of which is selected responsive to a carry out bit from the addition unit 202. As described further below, the particular carry out bit to perform these selections can change based on whether the FMA unit 100 (and thus the mantissa adder 112) performs a SP FMA operation or a DP FMA operation. In these examples, the signal labeled SP is asserted responsive to a SP FMA operation being performed, while the signal labeled DP is asserted responsive to a DP FMA operation being performed. The signals SP and DP are complementary.

In some examples, fewer than all of the bits of the addition unit 202 are used to compute the sum. In the SP FMA operation, the first and second SP operation share the 128-bit width of the addition unit 202. To ensure the addition of the second SP operation does not affect the addition of the first SP operation, a gap between the two operations is inserted at bit position 63. Accordingly, a carry out from the second SP operation (e.g., from the lower bits of the addition unit 202) does not propagate into the result of the first SP operation (e.g., into the upper bits of the addition unit 202). For uniformity, the MSB of the addition unit 202, bit 127, can also be left empty. The 128-bit addition unit 202 thus uses 126 bits to sum the lower 63 bits of each SP operation (e.g., second SP operation uses bits 0 through 62, first SP operation uses bits 64 through 126). Similarly, the DP FMA operation does not utilize the MSB of the addition unit 202, bit 127, in order to simplify the selection logic for the first mux 216 (e.g., DP uses bits 0 through 126).

In these examples, for a DP FMA operation, the carry in to bit 127 (e.g., Ci[127] or Ci[upper], more generally) is used to select the incremented or non-incremented outputs of incrementor A 206 and incrementor B 208 (e.g., for the upper 35 bits of addition). For example, Ci[127] selects one of the inputs to the second mux 218 (e.g., the incremented result from incrementor B 208 or the non-incremented result provided as the input to incrementor B 208), and the carry out from incrementor B 208 selects one of the inputs to the first mux 216 (e.g., the incremented result from incrementor A 206 or the non-incremented result provided as the input to incrementor A 206).

For a SP FMA operation, the carry in to bit 63 (e.g., Ci[63] or Ci[lower], more generally) is used to select the incremented or non-incremented outputs of incrementor B 208, and Ci[127] is used to select the incremented or non-incremented outputs of incrementor A 206.

Because of the different use cases for Ci[127] and Ci[63] depending on whether a SP or DP FMA operation is being performed, an additional AOI21 gate 220 and OAI21 gate 230 are implemented in parallel with the sum logic 214. The control signal provided to the first mux 216 is IncrA_sel and the control signal provided to the second mux 218 is IncrB_sel.

IncrB_sel is asserted (e.g., is a '1' and thus selects the incremented output of incrementor B 208) when either DP is asserted and Ci[127] is asserted, or when SP is asserted and Ci[63] is asserted. Accordingly, IncrB_sel can be represented as:

IncrB_sel=(Ci[127] && DP)||(Ci[63] && SP)

DeMorgan's theorem can be applied to the foregoing expression, which results in:

IncrB_sel=~((~Ci[127]||SP) && ~(Ci[63] && SP))

The portion ~(Ci[63] && SP) is able to be implemented by a NAND gate 240 in parallel with the upper bits of the addition unit 202 (e.g., bits 64-127) completing the group PG logic 212. Accordingly, this portion can be substituted for the term 'A', which results in:

IncrB_sel=~((~Ci[127]||SP) && A)

The preceding expression is implemented by the OAI21 gate 230. Further, the term ~Ci[127] is available as the carry out of the group PG logic 212 because in some examples, the levels of the group PG logic 212 are implemented with alternating OAI21 and AOI21 compound gates (e.g., to reduce or remove inverters at each logic level), and thus Ci[127] is on a level such that the actual value is inverted, and thus is ~Ci[127].

IncrA_sel is asserted (e.g., is a '1' and thus selects the incremented output of incrementor A 206) when either a) DP is asserted and both Ci[127] and the carry out of incrementor B 208 (e.g., IncrB_Co), orb) when SP is asserted and Ci[127] is asserted. Accordingly, IncrA_sel can be represented as:

IncrA_sel=(DP && Ci[127] && IncrB_Co)||(SP && Ci[127])

Reverse distribution can be applied to the foregoing expression, which results in:

IncrA_set=Ci[127] && ((DP && IncrB_Co)||SP)

As described above, DP and SP are complementary, and thus ~DP can be substituted for SP:

IncrA_set=Ci[127] && ((DP && IncrB_Co)||~DP)

The foregoing expression can be further simplified by applying the rule that (x+~x&y)=x+y, which results in:

IncrA_sel=Ci[127] && (IncrB_Co||~DP)

Finally, DeMorgan's theorem can be applied to the foregoing expression, which results in:

IncrA_sel=~(~Ci[127]||(~IncrB_Co && DP))

The preceding expression is implemented by the AOI21 gate 220.

In some examples, the successive levels of group PG logic 212 are implemented using alternating, complementary logic, such as to reduce delays that would be caused by using inverters that are not necessary. For example, a first level of group PG logic 212 produces an inverted result. However, rather than introduce an inverter to "correct" the inverted result, a second, subsequent level of group PG logic 212 is designed to accept the inverted result and to provide a non-inverted result, which avoids the delay that would be introduced by correcting the result of the first level of group PG logic 212 with an inverter. In the foregoing expressions for IncrB_sel, Ci[63] is provided by the group PG logic 212 as a non-inverted value, while Ci[127] is provided by the group PG logic 212 as an inverted value. Accordingly, the expressions can use Ci[63] and ~Ci[127] to reduce total delay because no inverters are used on the critical path to correct either value.

As described above, the first mux 216 and the second mux 218 select either incremented or non-incremented values of the upper bits of the shifted C operand responsive to the IncrA_sel and IncrB_sel signals, respectively. However, because the mantissa adder 112 supports both SP and DP FMA operations, the carry select signals for these upper bits (e.g., IncrA_sel and IncrB_sel signals) are delayed by an AOI21/OAI21 gate delay (e.g., from AOI21 gate 220 and OAI21 gate 230) relative to the sum logic 214.

Figure 3:
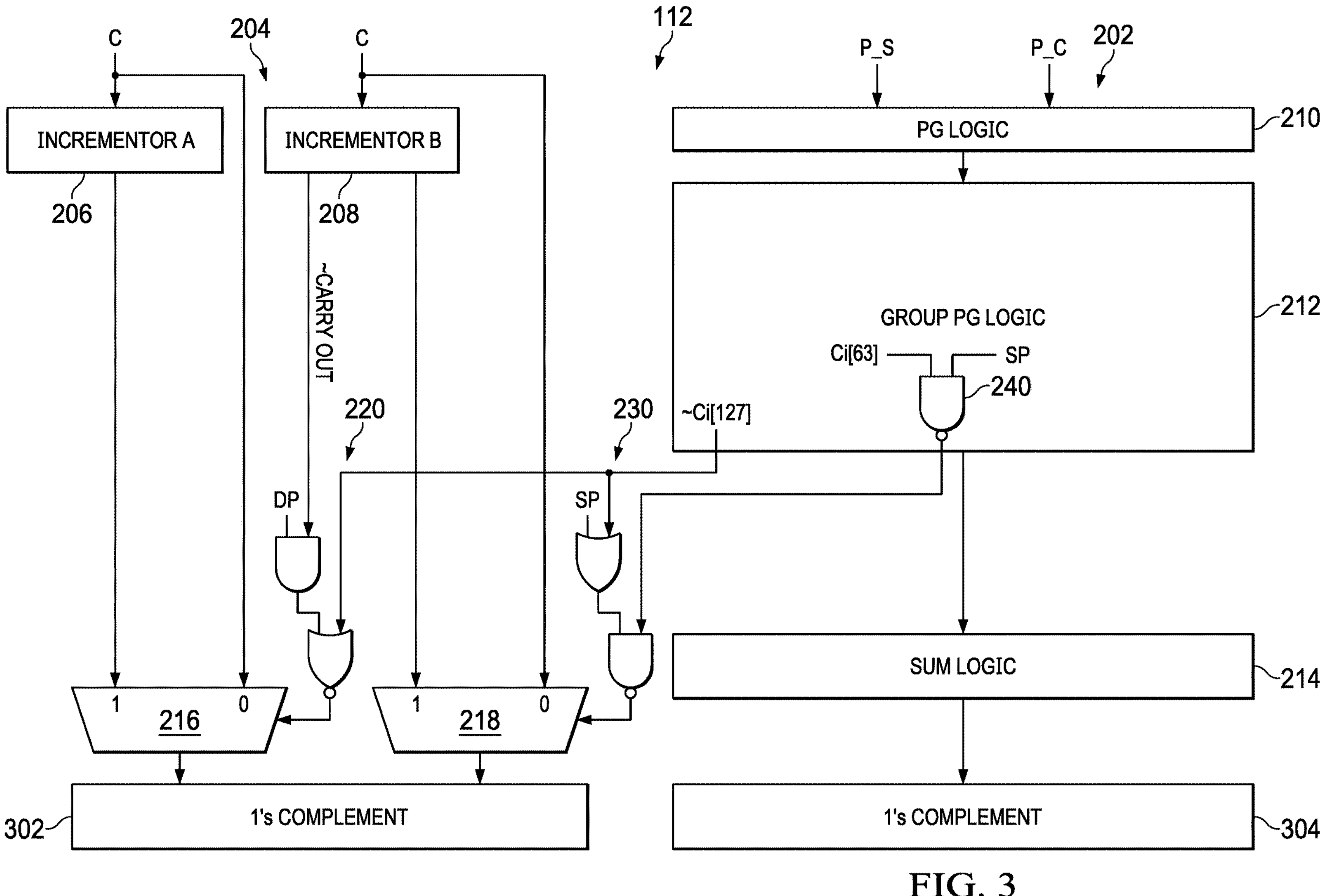
FIG. 3 is a schematic block diagram of the mantissa adder of FIG. 2 with 1's complement logic in accordance with various examples.

FIG. 3 is a schematic block diagram of the mantissa adder 112 of FIG. 2 with additional 1's complement logic 302 in an example. As described above, the results of the first mux 216 and the second mux 218 (e.g., the upper bits of the sum) are delayed relative to the sum logic 214 by an OAI21 gate delay. In the example of FIG. 3, 1's complement logic 302 is configured to receive as input the output from the first mux 216 and the second mux 218 and either provide a 1's complement output of the received input bits, or pass through the received input bits as the output of the 1's complement logic 302. Similarly, 1's complement logic 304 is configured to receive as input the output from the sum logic 214 and either provide a 1's complement output of the received input bits, or pass through the received input bits as the output of the 1's complement logic 304. For example, the 1's complement logic 302, 304 can be implemented as an XOR gate for each bit position, which receives the input bit as well as a control signal. In an example, the control signal is asserted responsive to a sign of the result from sum logic 214 (and muxes 216, 218) being negative. The XOR gate for that bit position passes through the input bit to the XOR output responsive to the control signal being a '0' (e.g., the 1's complement is not performed on positive results). The XOR gate for that bit position provides a 1's complement (e.g., inverted) of the input bit to the XOR output responsive to the control signal being a '1' (e.g., the 1's complement is performed on negative results).

However, because of the delay introduced by the AOI21 gate 220 and OAI21 gate 230, and the 1's complement logic 302 being after the carry select circuit (e.g., the first mux 216 and the second mux 218), the sum logic 214 and the 1's complement logic 304 for the lower bits waits for the carry select circuit and the 1's complement logic 302 to complete. Accordingly, the mantissa adder 112 delay is increased as well.

Figure 4:
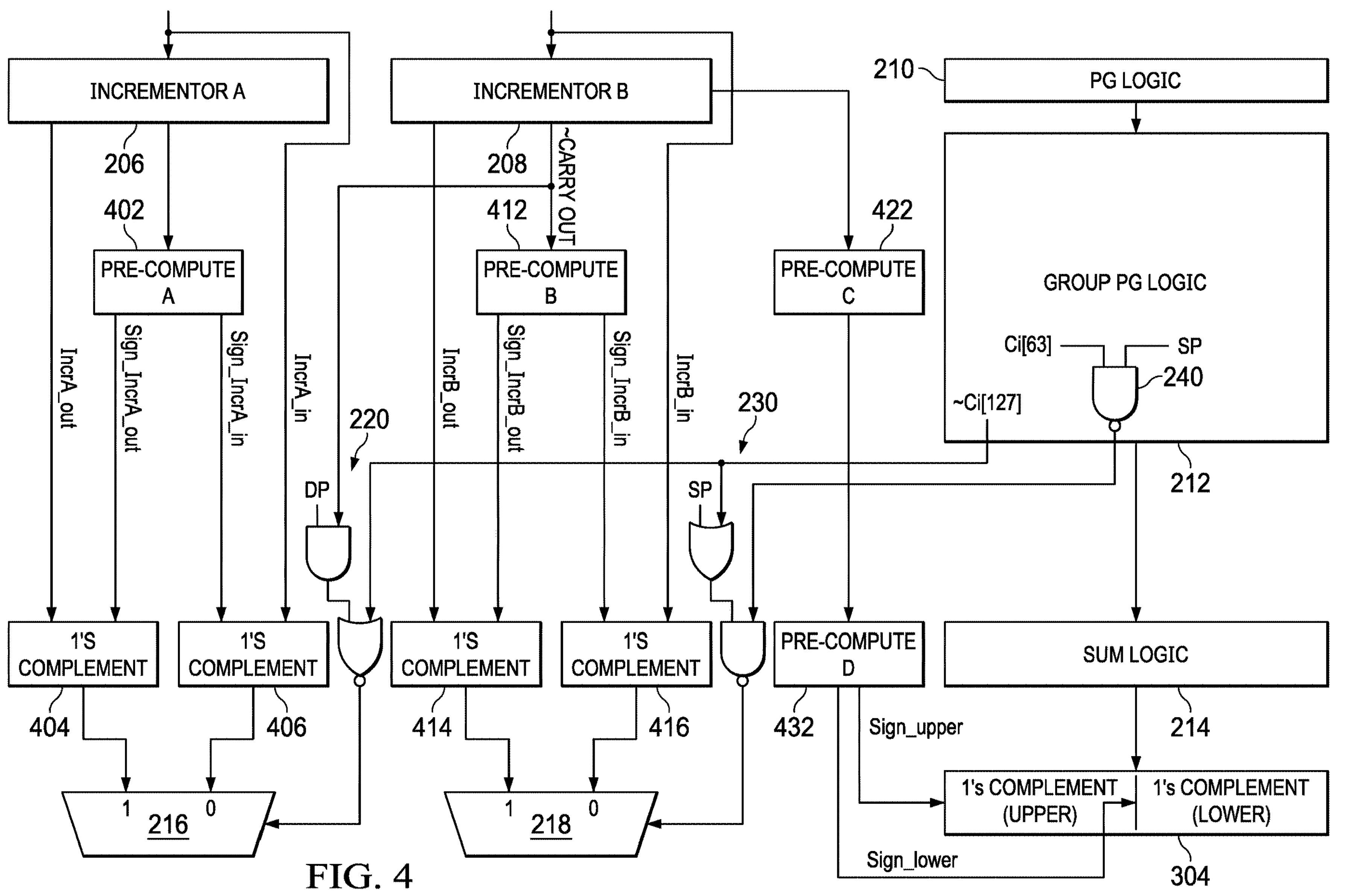
FIG. 4 is a schematic block diagram of the mantissa adder of FIG. 2 with a reduced 1's complement delay in accordance with various examples.

FIG. 4 is a schematic block diagram of the mantissa adder 112 of FIG. 2 with a reduced 1's complement delay in accordance with various examples. In the example of FIG. 4, the 1's complement operation for the upper bits of the shifted C operand (e.g., the bits that are not computed by the addition unit 202) is performed before the carry select circuit implemented by the first mux 216 and the second mux 218. This enables the 1's complement operation for the upper bits of the shifted C operand to be performed during a period of time in which the examples of FIGS. 2 and 3 wait for the carry select bits IncrA_sel and IncrB_sel to be provided from the AOI21 gate 220 and OAI21 gate 230, respectively.

In FIG. 4, the carry out bit(s) from the group PG logic 212 (e.g., Ci[127] and, for SP FMA operations, Ci[63]) are used to select the correct 1's complemented value. By contrast, in the examples of FIGS. 2 and 3, the carry out bit(s) from the group PG logic 212 are used to select the incremented or non-incremented value, from which the 1's complement is subsequently determined.

In FIG. 4, the lower bits of the addition (e.g., the result of the sum logic 214 of the addition unit 202) are 1's complemented in parallel with the carry select circuit implemented by the first mux 216 and the second mux 218. To facilitate the 1's complement of the lower bits, a sign of the final addition result is determined before it would be otherwise available from the carry select logic (e.g., the carry select logic being the outputs of AOI21 gate 220 and OAI21 gate 230). In some examples, the sign of the final addition result is determined in parallel with the sum logic 214.

To facilitate the foregoing reduction in delay and increase in performance of the mantissa adder 112, various pre-compute logic circuits are provided. The pre-compute logic circuits are useful to determine whether the upper and lower bits of the result of the mantissa adder 112 should be inverted or passed through by the 1's complement circuits.

In the following examples, IncrA_in represents the input to incrementor A 206 (e.g., the non-incremented value) and IncrA_out represents the output of incrementor A 206 (e.g., the incremented value). IncrB_in represents the input to incrementor B 208 (e.g., the non-incremented value) and IncrB_out represents the output of incrementor B 208 (e.g., the incremented value).

A first pre-compute circuit 402 (e.g., pre-compute A 402) is configured to provide signals to control whether IncrA_out and IncrA_in are inverted or passed through by 1's complement logic 404, 406, respectively. In this example, the control signal provided by pre-compute A 402 to the 1's complement logic 404 for IncrA_out (e.g., the incremented value) is Sign_IncrA_out, and the control signal provided by pre-compute A 402 to the 1's complement logic 406 for IncrA_in (e.g., the non-incremented value) is Sign_IncrA_in.

As described above, 1's complement logic 404, 406 can be implemented as a hardware circuit including an XOR gate for each bit position, which receives the input bit as well as a control signal. The XOR gate for that bit position passes through the input bit to the XOR output responsive to the control signal being a '0'. The XOR gate for that bit position provides a 1's complement (e.g., inverted) of the input bit to the XOR output responsive to the control signal being a '1'.

Irrespective of whether a SP or DP FMA operation is being performed, the sign bit for IncrA_in and IncrA_out is located at the MSB of those respective values. Because negative numbers (e.g., having a sign bit of '1') are inverted, while positive numbers (e.g., having a sign bit of '0') are passed through, pre-compute A 402 is configured to provide Sign_IncrA_out and Sign_IncrA_in responsive to those MSB values:

Sign_IncrA_out=IncrA_out[MSB]

Sign_IncrA_in=IncrA_in[MSB]

One expression is used (e.g., control signal provided) for each of the incremented and non-incremented values, to conditionally 1's complement those values, because either value can be selected by the first mux 216 to be part of the final sum output.

A second pre-compute circuit 412 (e.g., pre-compute B 412) is configured to provide signals to control whether IncrB_out and IncrB_in are inverted or passed through by 1's complement logic 414, 416, respectively. In this example, the control signal provided by pre-compute B 412 to the 1's complement logic 414 for IncrB_out (e.g., the incremented value) is Sign_IncrB_out, and the control signal provided by pre-compute B 412 to the 1's complement logic 416 for IncrB_in (e.g., the non-incremented value) is Sign_IncrB_in.

As described above, 1's complement logic 414, 416 can be implemented as a hardware circuit including an XOR gate for each bit position, which receives the input bit as well as a control signal. The XOR gate for that bit position passes through the input bit to the XOR output responsive to the control signal being a '0'. The XOR gate for that bit position provides a 1's complement (e.g., inverted) of the input bit to the XOR output responsive to the control signal being a '1'.

For DP FMA operations, the sign bit for IncrB_in and IncrB_out is located at the MSB of IncrA_in and IncrA_out, respectively. For SP FMA operations, the sign that determines whether IncrB_out (e.g., the incremented value) and IncrB_in (e.g., the non-incremented value) should be inverted is the MSB of IncrB_out and IncrB_in, respectively, similar to the pre-compute A 402 logic. The following are non-simplified expressions for the controls signals Sign_IncrB_in and Sign_IncrB_out:

Sign_IncrB_in=(DP && IncrA_in[MSB])||(~DP && IncrB_in[MSB])

Sign_IncrB_out=(DP && ((IncrB_out[carry] && IncrA_out[MSB])||(~IncrB_out[carry] && IncrA_in[MSB])))||(~DP && IncrB_out[MSB])

As above, one expression is used (e.g., control signal provided) for each of the incremented and non-incremented values, to conditionally 1's complement those values, because either value can be selected by the second mux 218 to be part of the final sum output.

The Sign_IncrB_in expression will be asserted to 1's complement the non-incremented value (IncrB_in) responsive to performing a DP FMA operation and the MSB of IncrA_in being a '1', indicating a negative number. The Sign_IncrB_in expression will also be asserted to 1's complement IncrB_in responsive to performing a SP FMA operation and the MSB of IncrB_in being a '1', indicating a negative number.

For the DP FMA operation, the sign of the upper bits of the shifted C operand is indicated by the MSB of the 23-bit incremented or non-incremented result (e.g., the output of, or input to incrementor A 206, respectively). For example, if the second mux 218 selects the non-incremented value, or the input to incrementor B 208, then the first mux 216 also selects the non-incremented value, or the input to incrementor A 206. In order for the second mux 218 to select the non-incremented value, or the input to incrementor B 208, there can be no carry out from the addition of the lower bits performed by the addition unit 202 (e.g., Ci[127]=0). Because the incrementor B 208 input bits are not incremented, then no carry out is propagated to incrementor A 206. Accordingly, the sign is indicated by IncrA_in[MSB].

Similar logic is applicable to the SP FMA operation. For example, in order for the second mux 218 to select the non-incremented value, or the input to incrementor B 208, there can be no carry out from the addition of the lower bits performed by the addition unit 202 (e.g., Ci[127]=0). Accordingly, the sign is indicated by IncrB_in[MSB].

The Sign_IncrB_out expression also leverages the fact that the second mux 218 selects the incremented value, or the output of incrementor B 208, responsive to the carry out from the addition of the lower bits performed by the addition unit 202 being high or asserted (e.g., Ci[127]=1).

The Sign_IncrB_out expression can be described: if a DP FMA operation is performed and IncrB_out propagates a carry out (e.g., IncrB_out[carry] is asserted) to incrementor A 206, Sign_IncrB_out is the MSB of the output of incrementor A 206 (e.g., the incremented value). Additionally, if a DP FMA operation is performed but the carry out does not propagate (e.g., IncrB_out[carry] is not asserted) to incrementor A 206, Sign_IncrB_out is the MSB of the input to incrementor A 206 (e.g., the non-incremented value). Finally, if a SP FMA operation is performed, Sign_IncrB_out will be asserted to 1's complement the incremented value (IncrB_out) responsive to the MSB of IncrB_out being a '1', indicating a negative number.

In some examples, it is useful to reduce or minimize the expressions of the pre-compute logic to provide sufficient time to 1's complement the results before the carry select signals (e.g., the outputs of the AOI21 gate 220 and the OAI21 gate 230) are available to select from the first mux 216 and the second mux 218, respectively. Pre-compute A 402 is relatively simple, and thus is able to complete responsive to incrementor A 206 providing an output. The first expression of pre-compute B 412, Sign_IncrB_in, can be implemented as a 2:1 mux with the DP signal provided as the control signal to the 2:1 mux, which is also sufficiently fast (e.g., can be assessed prior to OAI21 gate 230 providing its output to the second mux 218). However, the second expression of pre-compute B 412, Sign_IncrB_out, can be reduced further.

In an example, overflow is not possible. Accordingly, when IncrA_out[MSB] is asserted, IncrA_in[MSB] is also asserted because the incremented value is always larger than the non-incremented value. If the larger value is negative, the smaller value is negative as well, and so only IncrA_out[MSB] is checked. Further, IncrA_in[MSB] is assessed for the case where the non-incremented value is negative and the incremented value is positive (e.g., −1 incremented to 0). Accordingly, the Sign_IncrB_out expression can be rewritten:

Sign_IncrB_out=(DP && (IncrA_out[MSB]||(~IncrB_out[carry] && IncrA_in[MSB])))||(~DP && IncrB_out[MSB])

The DP term in the foregoing expression can be distributed to the inner terms, which results in:

Sign_IncrB_out=(DP && IncrA_out[MSB])||(DP && ~IncrB_out[carry] && IncrA_in[MSB])||(~DP && IncrB_out[MSB])

The terms (DP && ~IncrB_out[carry] && IncrA_in[MSB]) and (~DP && IncrB_out[MSB]) can each be evaluated before IncrA_out[MSB] is available. Accordingly, these terms can be substituted with 'A' and 'B' for simplicity:

Sign_IncrB_out=(DP && IncrA_out[MSB])||A||B

DeMorgan's theorem can be applied to the foregoing expression, which results in:

Sign_IncrB_out=~((~DP||~IncrA_out[MSB]) && ~A && ~B)

This final expression can be determined using an OAI211 compound logic gate.

As described above, once all of the sign signals (e.g., Sign_IncrA_in, Sign_IncrA_out, Sign_IncrB_in, Sign_IncrB_out) are determined, the 1's complement logic 404, 406, 414, 416 inverts or passes through the respective input bits using XOR gates.

The 1's complement logic 304 for the lower bits of the sum (e.g., the output of the sum logic 214) is still performed at a final logic level of the mantissa adder 112, similar to as in FIG. 3. Accordingly, additional time is available to compute the sign signals (e.g., Sign_upper and Sign_lower) that determine whether the 1's complement logic 304 inverts or passes through its respective input bits. In this example, a third pre-compute circuit 422 (e.g., pre-compute C 422) and a fourth pre-compute circuit 432 (e.g., pre-compute D 432) are configured to provide signals to control whether the upper bits (e.g., bits 64-126) and/or the lower bits (e.g., bits 0-62) of the sum logic 214 output are inverted or passed through by 1's complement logic 304. In this example, the control signal provided by pre-compute D 432 to the 1's complement logic 304 for the upper bits of the sum logic 214 output is Sign_upper, and the control signal provided by pre-compute D 432 to the 1's complement logic 304 for the lower bits of the sum logic 214 output is Sign_lower.

Sign_upper and Sign_lower are useful to handle both DP and SP FMA operations as described above, because Sign_upper corresponds to the upper half of the addition unit 202 output and Sign_lower corresponds to the lower half of the addition unit 202 output, which are different SP values. Irrespective of whether a DP or SP FMA operation is performed, Sign_upper and Sign_lower are dependent on the carry out bits generated by the group PG logic 212. Accordingly, pre-compute C 422 and pre-compute D 432 are bifurcated to enable meeting certain timing constraints, described below.

For example, Sign_upper is asserted to 1's complement the upper bits of the sum logic 214 output responsive to the following conditions being true: if the carry in bit from the upper portion of the addition unit 202 (e.g., Ci[127] or Ci[upper], more generally) is asserted, then for a SP FMA operation, the sign of the incremented output for the upper SP result (e.g., IncrA_out[MSB]) provides the value of Sign_upper. If Ci[upper] is asserted, then for a DP FMA operation, a determination is made as to whether the carry in (e.g., Ci[upper]) propagates (e.g., IncrB_out[carry] is asserted) to incrementor A 206. If the determination is that IncrB_out[carry] is asserted, the sign of the incremented output for the upper DP result (e.g., IncrA_out[MSB] provides the value of Sign_upper. If the determination is that IncrB_out[carry] is not asserted, the sign of the non-incremented output for the upper DP result (e.g., IncrA_in[MSB]) provides the value of Sign_upper. Finally, if Ci[upper] is not asserted, then the sign of the non-incremented output for the upper SP result or for the upper DP result (e.g., IncrA_in[MSB]) provides the value of Sign_upper. Accordingly, Sign_upper can be expressed as:

Sign_upper=Ci[upper] && ((~DP && IncrA_out[MSB])||(DP && ((IncrB_out[carry] && IncrA_out[MSB])||(~IncrB_out[carry] && IncrA_in[MSB]))))||(~Ci[upper] && IncrA_in[MSB])

The group PG logic 212 cannot provide the upper portion carry in bit (e.g., Ci[127] or Ci[upper], more generally) until the start of the sum logic 214 stage. As described above, the sum logic 214 is one XOR gate in depth, or delay. In some examples, the Sign_upper signal should be generated in parallel with the sum logic 214 stage to be available to the 1's complement logic 304 at approximately the same time as the result or output of the sum logic 214. Accordingly, the expression for Sign_upper is reduced to logic that is approximately equal to (or faster than) an XOR gate.

The expression for Sign_upper can be rewritten using the same overflow improvement described above:

Sign_upper=Ci[upper] && ((~DP && IncrA_out[MSB])||(DP && (IncrA_out[MSB]||(~IncrB_out[carry] && IncrA_in[MSB]))))||(~Ci[upper] && IncrA_in[MSB])

If IncrA_out[MSB] is asserted, then the expression becomes true for both SP and DP FMA operations when Ci[upper] is asserted. Accordingly, the dependency on the ~DP and DP signal for IncrA_out[MSB] can be removed:

Sign_upper=Ci[upper] && (IncrA_out[MSB]||(DP && (~IncrB_out[carry] && IncrA_in[MSB])))||(~Ci[upper] && IncrA_in[MSB])

Further, if the condition that is checked when Ci[upper] is asserted (e.g., (IncrA_out[MSB]||(DP && (~IncrB_out[carry] && IncrA_in[MSB])))) is also true, then the condition checked when Ci[upper] is not asserted (e.g., IncrA_in[MSB]) is true. Accordingly, the asserted Ci[upper] term can be removed because it cannot falsely signal true when Ci[upper] is not asserted:

Sign_upper=(IncrA_out[MSB]||(DP && (~IncrB_out[carry] && IncrA_in[MSB])))||(~Ci[upper] && IncrA_in[MSB])

Finally, the terms (IncrA_out[MSB]||(DP && (~IncrB_out[carry] && IncrA_in[MSB]))) do not depend on Ci[upper] and thus can each be evaluated before Ci[upper] is available. Accordingly, these terms can be substituted with 'C' for simplicity:

Sign_upper=C||(~Ci[upper] && IncrA_in[MSB])

The substituted terms 'C' can be performed by pre-compute C 422 before Ci[upper] is available from the group PG logic 212. Then, responsive to Ci[upper] being available from the group PG logic 212, pre-compute D 432 can provide the final Sign_upper using the result C provided by pre-compute C 422 and Ci[upper] from the group PG logic 212. In an example, pre-compute D 432 is configured to provide Sign_upper using an AOI21 or OAI21 gate (e.g., by applying DeMorgan's theorem) in parallel with the sum logic 214. In some examples, AOI21 and/or OAI21 gates are faster than an XOR gate, and thus pre-compute D 432 is able to satisfy timing constraints to allow the 1's complement logic 304 to perform the 1's complement (e.g., either invert or pass through) for the upper bits of the sum logic 214 output when those upper bits become available.

Continuing the above example, pre-compute C 422 and pre-compute D 432 should meet the same timing constraints to provide Sign_lower to the 1's complement logic 304 for the lower bits of the sum logic 214 output, as well.

Sign_lower is asserted to 1's complement the lower bits of the sum logic 214 output responsive to the following conditions being true: for DP FMA operations, if the carry in bit from the upper portion of the addition unit 202 (e.g., Ci[127] or Ci[upper], more generally) is asserted, then the same determinations are performed as above. For example, if the carry in (e.g., Ci[upper]) propagates to incrementor A 206, indicated by IncrB_out[carry] being asserted, then the sign of the incremented output for the upper DP result (e.g., IncrA_out[MSB]) provides the value of Sign_lower. Otherwise, if IncrB_out[carry] is not asserted, then the sign of the non-incremented output for the upper DP result (e.g., IncrA_in[MSB]) provides the value of Sign_lower. Also, for DP FMA operations, if Ci[upper] is not asserted, then the sign of the non-incremented output for the upper DP result (e.g., IncrA_in[MSB]) provides the value of Sign_lower.

For SP FMA operations, if the carry in bit from the lower portion of the addition unit 202 (e.g., Ci[63] or Ci[lower], more generally) is asserted, then the sign of the incremented output for the lower SP result (e.g., IncrB_out[MSB]) provides the value of Sign_lower. Otherwise, for SP FMA operations, if Ci[lower] is not asserted, then the sign of the non-incremented output for the lower SP result (e.g., IncrB_in[MSB]) provides the value of Sign_lower. Accordingly, Sign_lower can be expressed as:

Sign_lower=(Ci[upper] && DP && ((IncrB_out[carry] && IncrA_out[MSB])||(~IncrB_out[carry] && IncrA_in[MSB])))||(~Ci[upper] && DP && IncrA_in[MSB])||(Ci[lower] && ~DP && IncrB_out[MSB])||(~Ci[lower] && ~DP && IncrB_in[MSB])

The expression for Sign_lower can be rewritten using the same overflow improvement described above, in which if IncrA_out[MSB] is asserted, then IncrA_in[MSB] is also asserted:

Sign_lower=(Ci[upper] && DP && (IncrA_out[MSB]||(~IncrB_out[carry] && IncrA_in[MSB])))||(~Ci[upper] && DP && IncrA_in[MSB])||(Ci[lower] && ~DP && IncrB_out[MSB])||(~Ci[lower] && ~DP && IncrB_in[MSB])

Similar to above, if the condition that is checked when Ci[upper] is asserted and it is a DP FMA operation, (e.g., (IncrA_out[MSB]||(~IncrB_out[carry] && IncrA_in[MSB]))) is also true, then the condition checked when Ci[upper] is not asserted (e.g., IncrA_in[MSB]) is true. Accordingly, the Ci[upper] term can be removed because it cannot falsely signal true when Ci[upper] is not asserted:

Sign_lower=(DP && (IncrA_out[MSB]||(~IncrB_out[carry] && IncrA_in[MSB])))||(~Ci[upper] && DP && IncrA_in[MSB])||(Ci[lower] && ~DP && IncrB_out[MSB])||(~Ci[lower] && ~DP && IncrB_in[MSB])

Then, if the condition that is checked when Ci[lower] is asserted and it is a SP FMA operation (e.g., IncrB_out[MSB]) is also true, then the condition checked when Ci[lower] is not asserted (e.g., IncrB_in[MSB]) is true. Accordingly, the asserted Ci[lower] term can be removed because it cannot falsely signal true when Ci[lower] is not asserted:

Sign_lower=(DP && (IncrA_out[MSB]||(~IncrB_out[carry] && IncrA_in[MSB])))||(~Ci[upper] && DP && IncrA_in[MSB])||(~DP && IncrB_out[MSB])||(~Ci[lower] && ~DP && IncrB_in[MSB])

Also similar to above, various terms do not depend on Ci[upper] or Ci[lower] and thus can be evaluated before Ci[upper] or Ci[lower] are available. For example, 'A' is substituted for the term (DP && (IncrA_out[MSB]||(~IncrB_out[carry] && IncrA_in[MSB]))); 'B' is substituted for the term (DP && IncrA_in[MSB]); 'C' is substituted for the term (~DP && IncrB_out[MSB]); and 'D' is substituted for the term (~DP && IncrB_in[MSB]):

Sign_lower=A||(~Ci[upper] && B)||C||(~Ci[lower] && D)

The A and C substitutions are merged and replaced with 'E':

Sign_lower=E||(~Ci[upper] && B)||(~Ci[lower] && D)

Finally, the E substitution is merged with (~Ci[lower] && D) and replaced with 'F'. This final replacement is possible because ~Ci[lower] is available one group PG logic 212 level before Ci[upper]. The group PG logic 212 uses OAI21 and AOI21 gates, and thus F can be produced with an OAI21 gate having an approximately equal delay as Ci[upper]:

Sign_lower=F||(~Ci[upper] && B)

The substituted terms 'F' can be performed by pre-compute C 422 before Ci[upper] is available from the group PG logic 212. Then, responsive to Ci[upper] being available from the group PG logic 212, pre-compute D 432 can provide the final Sign_lower using the result F provided by pre-compute C 422 and Ci[upper] from the group PG logic 212. In an example, pre-compute D 432 is configured to provide Sign_lower using an AOI21 or OAI21 gate (e.g., by applying DeMorgan's theorem) in parallel with the sum logic 214. In some examples, AOI21 and/or OAI21 gates are faster than an XOR gate, and thus pre-compute D 432 is able to satisfy timing constraints to allow the 1's complement logic 304 to perform the 1's complement (e.g., either invert or pass through) for the lower bits of the sum logic 214 output when those lower bits become available.

By providing the pre-compute circuits 402, 412, 422, 432, described above, the mantissa adder 112 is able to provide a final result, including performing 1's complement when appropriate, with a reduced delay relative to a mantissa adder 112 in which the 1's complement is performed after a full sum result has been computed. Further, the pre-compute circuits 402, 412, 422, 432, described above, facilitate such a reduced delay for both SP FMA operations (e.g., in which the mantissa adder 112 provides one SP result (SP0_out) based on lower bits from the addition unit 202 and the incrementor B 208 input/output, and another SP result (SP1_out) based on upper bits from the addition unit 202 and the incrementor A 206 input/output) and DP FMA operations (e.g., in which the mantissa adder 112 provides a DP_out result from the addition unit 202 and the combined incrementor A 206 and incrementor B 208 input/output bits). For example, for SP FMA operations, the lower bits from the 1's complement logic 304 are concatenated with the output of the second mux 218 (e.g., incrementor B 208 input/output, optionally 1's complemented) to provide the SP0_out final sum, while the upper bits from the 1's complement logic 304 are concatenated with the output of the first mux 216 (e.g., incrementor A 206 input/output, optionally 1's complemented) to provide the SP1_out final sum. For DP FMA operations, the bits from the 1's complement logic 304 are concatenated with the output of the first and second muxes 216, 218 (e.g., combined incrementor A 206 and incrementor B 208 input/output, optionally 1's complemented) to provide the DP_out final sum.

Figure 5:
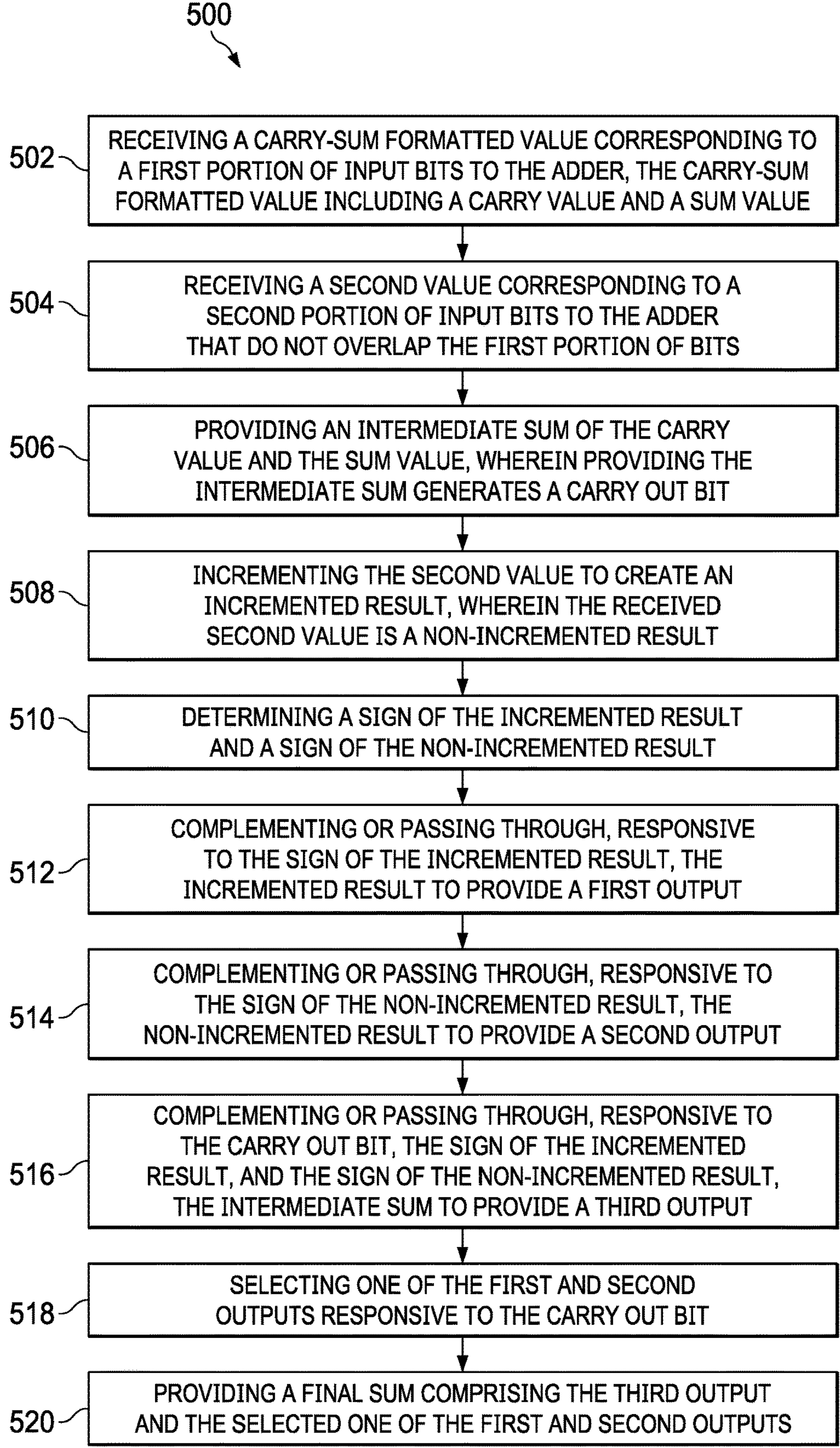
FIG. 5 is a flow chart of method for performing mantissa addition for a FMA operations with a reduced 1's complement delay in accordance with various examples.

FIG. 5 is a flow chart of a method 500 for performing mantissa addition for a DP FMA operation with reduced 1's complement delay, in accordance with examples of this description. The method 500 can be modified for dual SP FMA operations as well, as described with respect to various blocks below. The method 500 begins in block 502 with receiving, by an adder, a carry-sum formatted value corresponding to a first portion of input bits to the adder, the carry-sum formatted value including a carry value and a sum value. The method 500 also includes, at block 504, receiving a second value corresponding to a second portion of input bits to the adder that do not overlap the first portion of bits. For example, the mantissa adder receives the carry-sum formatted compressed output (e.g., P_S and P_C), which reflects the carry-sum formatted product of A*B and the portion of the C operand that overlaps, or is aligned with, the A*B result. The mantissa adder 112 also receives the non-overlapped shifted C operand bits (e.g., labeled C for simplicity), and provides an output that is a sum of the shifted C operand and the carry-sum formatted compressed output.

The method 500 continues in block 506 with providing an intermediate sum of the carry value and the sum value, in which providing the intermediate sum generates a carry out bit. For example, the addition unit 202 provides an intermediate sum of P_S and P_C, which are received from the compressor 110. In dual SP FMA operation examples, the block 506 is modified to include providing a first intermediate sum of a more-significant portion of the carry value and the sum value (e.g., the upper portion of group PG logic 212 and sum logic 214), which generates an upper carry out bit (e.g., Ci[127]). The block 506 is also modified to include providing a second intermediate sum of a less-significant portion of the carry value and the sum value (e.g., the lower portion of group PG logic 212 and sum logic 214), which generates a lower carry out bit (e.g., Ci[63]).

The method 500 continues in block 508 with incrementing the second value to create an incremented result, in which the received second value is a non-incremented result. For example, the incrementors 206, 208 are configured to provide an incremented sum of their input bits (e.g., the upper, non-overlapping bits of the shifted C operand. In dual SP FMA operation examples, the block 508 is modified to include incrementing a more-significant portion of the second value to create a first incremented result, in which the more-significant portion of the received second value is a first non-incremented result. The block 508 is also modified to include incrementing a less-significant portion of the second value to create a second incremented result, in which the less-significant portion of the received second value is a second non-incremented result.

The method 500 continues in block 510 with determining a sign of the incremented result (e.g., Sign_IncrA_out and/or Sign_IncrB_out) and a sign of the non-incremented result (e.g., Sign_IncrA_in and/or Sign_IncrB_in). In some cases, the sign of the incremented result and the sign of the non-incremented result are determined before the intermediate sum is provided in block 506. In dual SP FMA operation examples, the block 510 is modified to include determining a sign of the first incremented result, a sign of the first non-incremented result, a sign of the second incremented result, and a sign of the second non-incremented result.

The method 500 continues in block 512 with complementing or passing through, responsive to the sign of the incremented result, the incremented result to provide a first output (e.g., 1's complement logic 404, 414). In some cases, block 512 is performed before the intermediate sum is provided in block 506.

The method 500 continues in block 514 with complementing or passing through, responsive to the sign of the non-incremented result, the non-incremented result to provide a second output (e.g., 1's complement logic 406, 416). In some cases, block 514 is performed before the intermediate sum is provided in block 506. In dual SP FMA operation examples, the blocks 512 and 514 are modified to include complementing or passing through each of: the first incremented result, responsive to the sign of the first incremented result, to provide a first output (e.g., 1's complement logic 404); the first non-incremented result, responsive to the sign of the first non-incremented result, to provide a second output (e.g., 1's complement logic 406); the second incremented result, responsive to the sign of the second incremented result, to provide a third output (e.g., 1's complement 414); and the second non-incremented result, responsive to the sign of the second non-incremented result, to provide a fourth output (e.g., 1's complement logic 416).

The method 500 continues in block 516 with complementing or passing through, responsive to the carry out bit, the sign of the incremented result, and the sign of the non-incremented result, the intermediate sum to provide a third output (e.g., 1's complement logic 304). In dual SP FMA operation examples, the block 516 is modified to include complementing or passing through, responsive to the upper carry out bit, the sign of the first incremented result, and the sign of the first non-incremented result, the first intermediate sum to provide a fifth output (e.g., 1's complement logic 304 (upper)); and complementing or passing through, responsive to the lower carry out bit, the sign of the second incremented result, and the sign of the second non-incremented result, the second intermediate sum to provide a sixth output (e.g., 1's complement logic 304 (lower)).

The method 500 continues in block 518 with selecting one of the first and second outputs responsive to the carry out bit (e.g., mux 216 and/or mux 218). In dual SP FMA operation examples, the block 518 is modified to include selecting one of the first and second outputs (e.g., from 1's complement logic 404, 406) responsive to the upper carry out bit (e.g., mux 216) and selecting one of the third and fourth outputs (e.g., from 1's complement logic 414, 416) responsive to the lower carry out bit (e.g., mux 218).

The method 500 continues in block 520 with providing a final sum comprising the third output and the selected one of the first and second outputs. For example, the final sum of mantissa adder 112 is provided by concatenating the output of the mux 216 and/or mux 218 with the output from the 1's complement logic 304, as described above.

As described above, it is useful to improve the efficiency and/or performance of FMA operations. Accordingly, other examples of this description include such improvements to the FMA unit 100 and, more particularly, to the normalizer 116 and/or the rounding unit 120. As in the above examples, certain of the following examples refer at times to various values having specific numbers of bits, for ease of explanation and/or to demonstrate various circuit functionality. However, the scope of this description is not limited to values having such specific numbers of bits unless explicitly stated. Further, in the following examples, reference is made to certain arrangements of logic gates and/or implementations of logical functions. However, such logical functions can be implemented differently in other examples (e.g., using different logic gates and/or combinations of logic gates), and the scope of this description is not limited to specific arrangements of logic gates unless explicitly stated.

As described above, the mantissa adder 112 is configured to produce a 1's complement output (e.g., sum) to facilitate a subsequent 2's complement operation so that the result of the FMA operation is in 2's complement format. Because floating point format includes a sign bit separate from the mantissa, a mantissa is represented as a positive number even if the result that produced that mantissa is negative (e.g., the sign bit represents the negative aspect of the result, while the mantissa v is represented as a positive number). Accordingly, the mantissa of a negative result of the FMA operation is 2's complemented to produce a mantissa having a positive value, and the negative nature of the result is reflected in the sign bit of the floating point result of the FMA operation.

In some cases, if the result of the mantissa adder 112 needs to be 2's complemented (e.g., a 1's complement was performed by the mantissa adder 112), the result of the mantissa adder 112 is incremented, then normalized by normalizer 116, and then rounded by the rounding unit 120. However, in these cases, the 2's complement increment is performed on the critical path, and thus increases a delay of the FMA operation performed by the FMA unit 100.

Accordingly, examples of this description merge the 2's complement operation (e.g., incrementing) with the round logic implemented by the rounding unit 120. Because the 2's complement and rounding operations both modify, if at all, the result (e.g., the input to the rounding unit 120) by adding 1, logic additional to the sticky logic to compute the sticky bit is provided to determine whether to add 1 to the result. These and other examples are described further below.

As described above, a 2's complement is performed if a negative result was obtained in the mantissa adder 112. For example, a negative result causes the mantissa adder 112 to perform a 1's complement as described, so that the mantissa value is positive, while the sign is reflected in the sign bit of the floating point value. Accordingly, in order to complete the 2's complement, the result from the mantissa adder 112 is incremented. Examples of this description utilize rounding logic in the rounding unit 120 to select the rounded (e.g., incremented) result responsive to a 2's complement being performed. The rounding logic in the rounding unit 120 is configured to operate on (e.g., round) normalized mantissa values, which can be 24-bit (SP) or 53-bit (DP) values in some examples (e.g., one implied bit and either 23 or 52 mantissa bits). However, the 2's complement is completed on the full-width, 76-bit (SP) or 163-bit (DP) values from the mantissa adder 112.

Figures 6A, 6B:
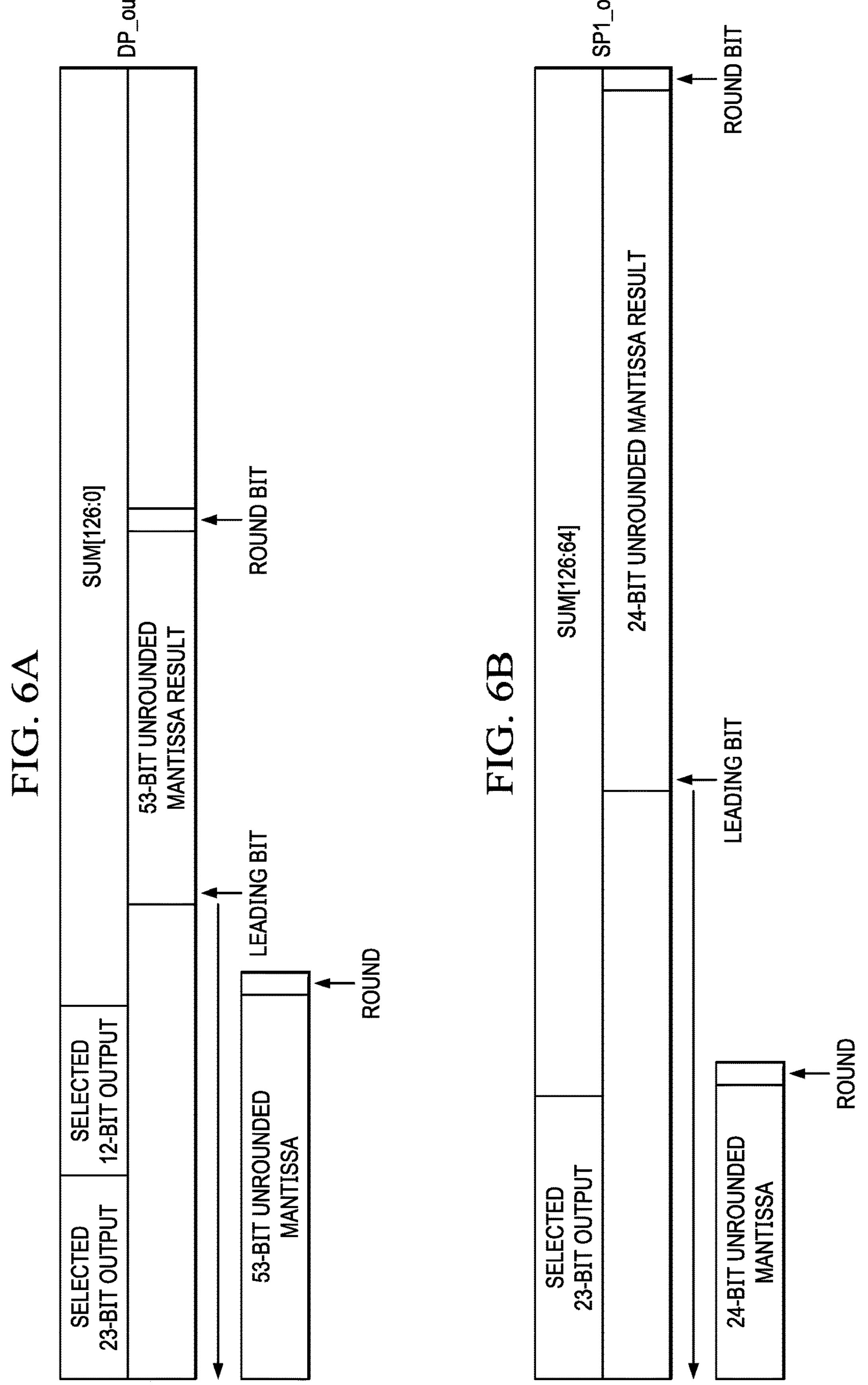
FIGS. 6A-6C are schematic diagrams of example left shifting for normalization in a FMA operation in accordance with various examples.
Figure 6C:
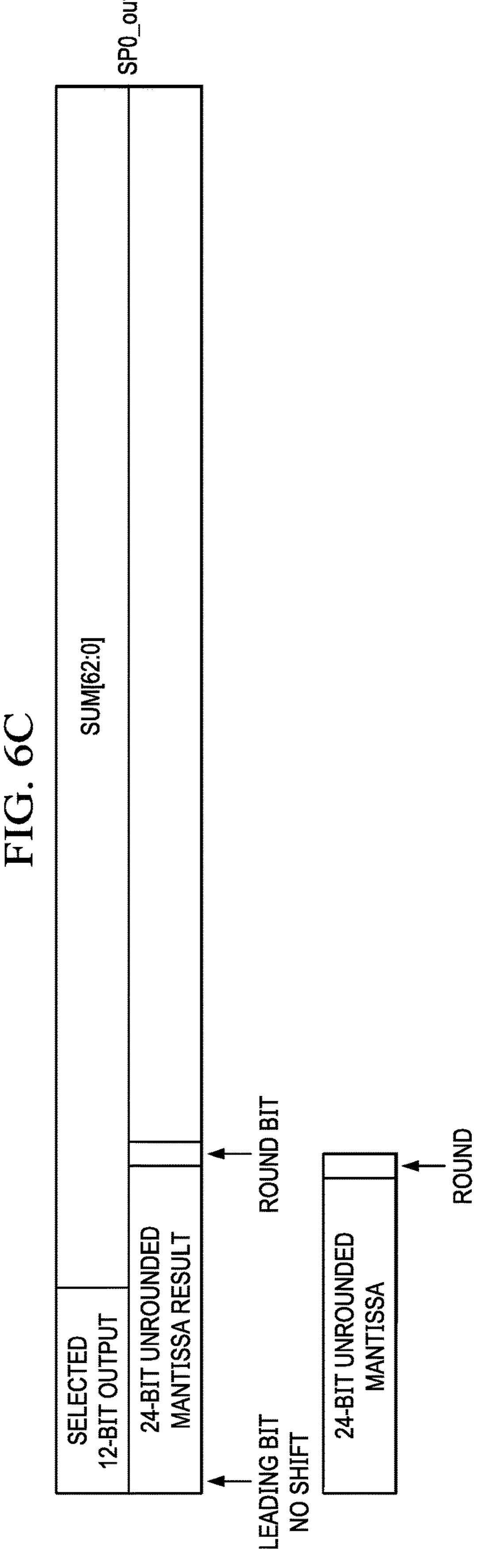

As additional context for the function of the rounding unit 120, FIGS. 6A-6C are schematic diagrams of example normalization left shifting implemented by the normalizer 116 in a FMA operation in accordance with various examples. The normalizer 116 is configured to receive the result from the mantissa adder 112 and to perform a left shift (e.g., normalize) the result from the mantissa adder 112 to a 24-bit value (SP) or a 53-bit value (DP). The left shift amount is determined responsive to the location of the "leading bit" in the result from the mantissa adder 112, or the most-significant bit position that has a value of 1. The normalizer 116 effectively discards bits greater than the leading bit, which have a value of 0. The normalizer 116 is also configured to provide the next less-significant bit after the 24- or 53-bit value, and this bit is referred to as the round bit. The normalizer 116 also effectively discards LSBs below the round bit, because these are less significant than the size that the mantissa representation is limited to. As described further below, the round bit is useful to determine whether to round up or down in various rounding modes.

FIG. 6A shows an example of normalizing the DP_out floating point value. As described above, for a DP FMA operation, the output of the mantissa adder 112 comprises Sum[126:0] from the addition unit 202 and the selected 23- and 12-bit outputs from the incrementor circuit 204. In FIG. 6A, the leading bit is located in the Sum[126:0] portion, and the normalizer 116 is configured to shift the 53 bits including the leading bit, plus the next less-significant bit (e.g., a 54th bit) as the round bit, to the left so that the leading bit is aligned with the MSB of the mantissa adder 112 output. In an example in which there are 60 0s greater than the leading bit, the normalizer 116 is configured to shift the 54 bits (e.g., the 53-bit unrounded mantissa plus the round bit) to the left by 60. The normalizer 116 is configured to provide shifted 54 bits as its output.

FIG. 6B shows an example of normalizing the SP1_out floating point value. As described above, for a SP FMA operation, SP1_out of the mantissa adder 112 comprises Sum[126:64] from the addition unit 202 and the selected 23-bit output from the incrementor circuit 204. In FIG. 6B, the leading bit is located in the Sum[126:64] portion, and the normalizer 116 is configured to shift the 24 bits including the leading bit, plus the next less-significant bit (e.g., a 25th bit) as the round bit, to the left so that the leading bit is aligned with the MSB of the SP1_out portion of the mantissa adder 112 output. In an example in which there are 40 0s greater than the leading bit, the normalizer 116 is configured to shift the 25 bits (e.g., the 24-bit unrounded mantissa plus the round bit) to the left by 40. The normalizer 116 is configured to provide shifted 25 bits as its output.

FIG. 6C shows an example of normalizing the SP0_out floating point value. As described above, for a SP FMA operation, SP0_out of the mantissa adder 112 comprises Sum[62:0] from the addition unit 202 and the selected 12-bit output from the incrementor circuit 204. In FIG. 6C, the leading bit is the MSB of the selected 12-bit output, and thus no shift is needed (e.g., the 24-bit unrounded mantissa cannot be shifted further to the left). In this example, the normalizer 116 is configured to pass through as its output the 24 most-significant bits of SP0_out, including the leading bit, plus the next less-significant bit (e.g., a 25th bit) as the round bit.

The normalizer 116 is also configured to generate a sticky bit, which is an OR reduction of the LSBs that are less significant than the round bit. The sticky bit provides an ability to track whether there existed any asserted (e.g., having a value of 1) bits that were less significant than the round bit. For example, if the round bit represents a value of 0.5, then an asserted sticky bit indicates a result that is greater than 0.5.

In some examples, the 24- or 53-bit results or output of the normalizer 116 are not exact values. In these examples, the exact result cannot fit within the output width, and thus the inexact result is rounded according to a rounding mode. In some examples, the rounding mode is user-selectable, and the rounding unit 120 is thus configured to implement one of multiple rounding modes (e.g., the rounding mode presently selected by the user).

Because floating point values are represented in a sign and magnitude form, rounding down is similar to performing no round at all. For example, rounding down results in discarding the round bit and to ignore information contained in the sticky bit. The rounded result is effectively rounded down, because its magnitude is smaller than (or equal to) the exact value of the unrounded result. On the other hand, rounding up is performed by incrementing the 24- or 53-bit unrounded result because this increases the magnitude of the rounded result relative to the unrounded result. Rounded up negative values become more negative, while rounded up positive values become more positive.

In some examples, the rounding unit 120 supports four IEEE compliant rounding modes. A first rounding mode is round to nearest, ties to even (RNE). RNE rounds to the nearest value, while a tie occurs when the round bit is asserted and the sticky bit is not asserted. In the tie scenario, the unrounded result is precisely between representable values (e.g., the round bit is a 1, but all less-significant bits are 0s). In the tie scenario, the LSB of the 24- or 53-bit unrounded result controls the rounding behavior. Responsive to the unrounded result being odd (e.g., LSB equal to 1), the result is rounded up to the next even value. Responsive to the unrounded result being even (e.g., LSB equal to 0), the result "rounds down" (e.g., remains at the already-even value).

A second rounding mode is round to zero (RD). RD always rounds down in magnitude. In this rounding mode, the round and sticky bits are discarded or otherwise ignored.

A third rounding mode is round towards positive infinity (RPI). RPI rounds up responsive to the unrounded result being positive and not exact (e.g., a round and/or sticky bit of 1). RPI does not round responsive to the unrounded result being negative, because not rounding reduces (or maintains) the magnitude of the rounded result relative to the unrounded result, and if the sign is negative, reducing the magnitude of the rounded result is rounding towards positive infinity.

A fourth rounding mode is round towards negative infinity (RNI). RNI rounds up responsive to the unrounded result being negative and not exact (e.g., a round and/or sticky bit of 1). RNI does not round responsive to the unrounded result being positive, because not rounding reduces (or maintains) the magnitude of the rounded result relative to the unrounded result, and if the sign is positive, reducing the magnitude of the rounded result is rounding towards negative infinity.

In some examples, the rounding unit 120 supports an additional IEEE rounding mode for the FMA operation, which is called round to nearest, ties to max magnitude (RMM). RMM is similar to RNE, except that the tie scenario for RMM always results in rounding up to the next-highest magnitude value.

Figure 7:
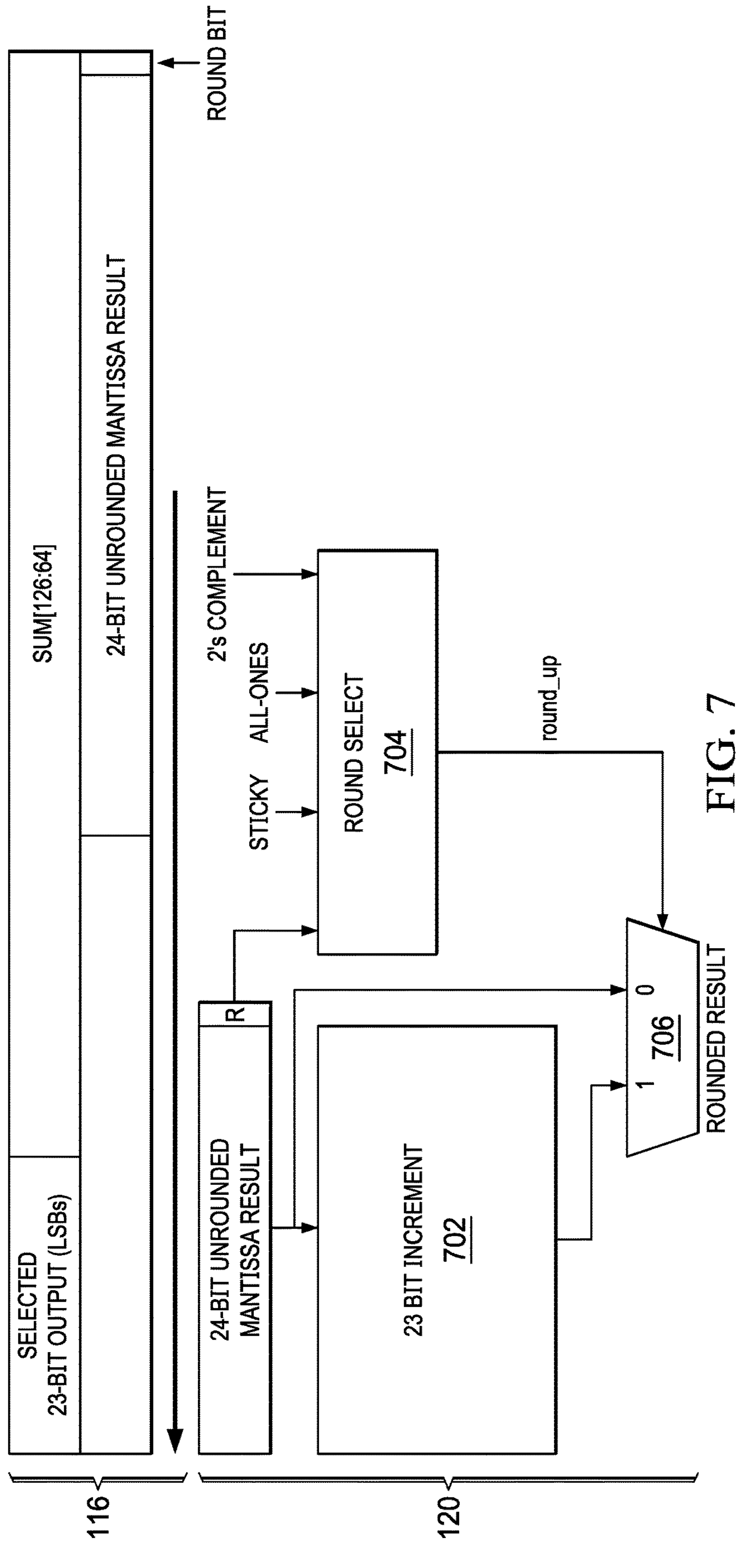
FIG. 7 is a schematic block diagram of a merged 2's complement and rounding circuit in accordance with various examples.

FIG. 7 is a schematic block diagram of a merged 2's complement and rounding circuit (e.g., the rounding unit 120) in accordance with various examples. FIG. 7 continues the normalization example of FIG. 6B, and accordingly is directed to operating on a 24-bit unrounded SP result. However, the rounding unit 120 includes similar such functionality to operate on a 53-bit unrounded DP result as well.

As described, the rounding unit 120 is configured to receive the unrounded, normalized result from the normalizer 116. In the SP example of FIG. 7, the rounding unit 120 thus receives 25 bits (e.g., the 24-bit unrounded mantissa plus the round bit). The rounding unit 120 includes a 24-bit incrementor 702, which receives the 24-bit unrounded result from the normalizer 116 and provides as its output a 24-bit incremented result. A corner case exists in which the increment propagates through all mantissa bits and the implied bit to produce a carry out, which would increment the exponent of the resulting floating point value. For simplicity, the carry out is not shown FIG. 7. The rounding unit 120 also includes rounding select logic 704, which determines whether the rounding unit 120 provides an incremented (e.g., rounded up) or non-incremented (e.g., rounded down) result as its output. For example, the rounding select logic 704 is configured to provide a rounding output (round_up) that is asserted responsive to a determination that the incremented output of the incrementor 702 is to be provided as the rounding unit 120 output, and is de-asserted responsive to a determination that the non-incremented output (e.g., the input to the incrementor 702) is to be provided as the rounding unit 120 output.

To implement this selection, the rounding unit 120 includes a mux 706. The mux 706 has a first input configured to receive the input to the incrementor 702 (e.g., the non-incremented, unrounded mantissa result from the normalizer 116). The mux 706 also has a second input configured to receive the output bits from incrementor 702. The mux 706 is configured to receive the rounding output (round_up) as a control signal. The mux 706 is configured to provide non-incremented, unrounded mantissa result from the normalizer 116 responsive to round_up being 0, and to provide the incremented, rounded mantissa result from the incrementor 702 responsive to round_up being 1.

In examples in which the 2's complement completion is not merged with the rounding implemented by the rounding unit 120, the rounding select logic 704 implements one of the five rounding mode described above—RNE, RD, RPI, RNI, RMM—according to the following expressions:

RNE: round_up=round && (sticky||LSB) 1.

RD: round_up=0 2.

RPI: round_up=~sign && (round||sticky) 3.

RNI: round_up=sign && (round||sticky) 4.

RMM: round_up=round 5.

In the foregoing expressions, round is the round bit (e.g., the bit below the LSB of the unrounded result from the normalizer 116), sticky is the sticky bit, LSB is the LSB of the unrounded mantissa result from the normalizer 116, and sign is the resulting floating point sign bit.

Figures 8, 9:
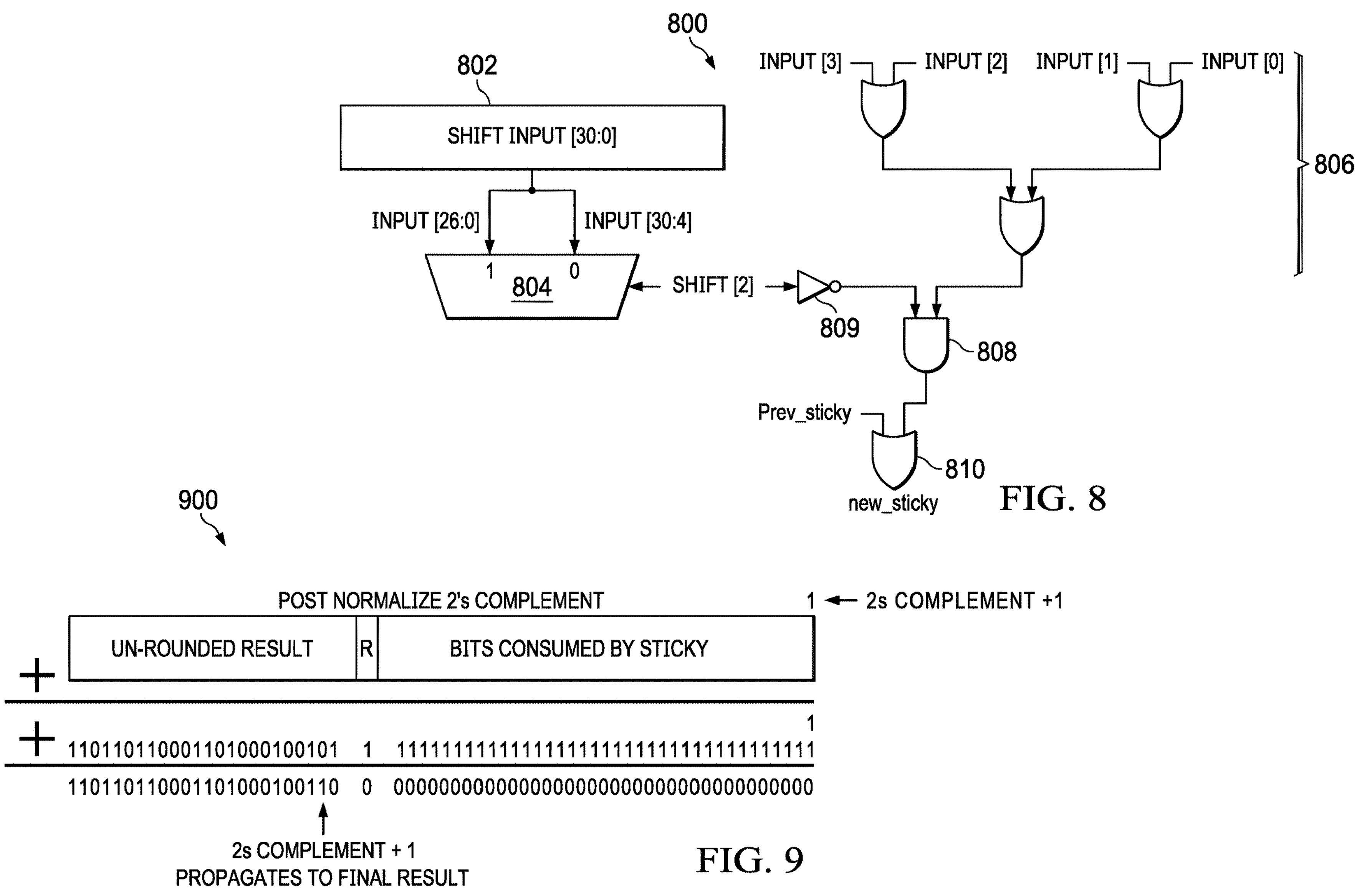
FIG. 8 is a schematic diagram of a circuit that is configured to provide a sticky bit in a FMA operation in accordance with various examples.
FIG. 9 is an example of completing a 2's complement after normalization in a FMA operation in accordance with various examples.

As described above, the sticky bit is an OR reduction of the LSBs less than the round bit from the normalizer 116. FIG. 8 is a schematic circuit diagram of sticky logic 800 that is configured to provide a sticky bit in a FMA operation in accordance with various examples. The sticky logic 800 is provided in parallel with (e.g., as a part of) the normalizer 116.

In the example of FIG. 8, the sticky logic 800 is for one level of shifting, for a normalization shift of 4. In this example, the sticky logic 800 receives a 31-bit input 802 (e.g., from a previous shift level) and provides an unshifted value (e.g., input[30:4]) to a first input of a mux 804, and a left-shifted value (e.g., input[26:0]) to a second input of the mux 804. A "shift" signal is provided to the mux 804 as a control signal, and shift is asserted responsive to a determination that this level of left-shifting is to be performed, as described above.

An OR reduction network 806 is configured to receive the LSBs of the input 802 that would be lost in a shift, or moved into the resulting output of the mux 804 responsive to the left shift being performed (e.g., shift being a 1). In this example, the OR reduction network 806 thus receives input 802 bits 3-0 and provides an output that is the OR reduction of the input 802 bits 3-0.

An inverter 809 is configured to receive the shift signal as its input, and to provide an inverted shift signal as its output. An AND gate 808 receives the output of the OR reduction network 806 as a first input, and the output of the inverter 809 as a second input. Accordingly, responsive to the shift being performed (e.g., shift is asserted, and the output of the inverter 809 is de-asserted), the OR reduction network 806 does not modify the value of the sticky bit because all of the LSBs of the input 802 are moved into the resulting output of the mux. However, responsive to the shift not being performed (e.g., shift is de-asserted, and the output of the inverter 809 is asserted), the OR reduction network 806 checks whether any of input 802 bits 3-0 are a 1 and, if so, these bits are included into the sticky bit calculation by OR gate 810. For example, OR gate 810 receives the output of AND gate 808 as a first input, and a previous shift stage sticky calculation (labeled prev_sticky) as a second input. The output of the OR gate 810 is the current stage's sticky calculation (labeled new_sticky) and, when the current stage is a final shift stage, the output of the OR gate 810 is the sticky bit that is provided to the rounding select logic 704 of the rounding unit 120.

In some cases, the 2's complement can be completed by incrementing (if needed) the pre-normalized result, such as the output of the mantissa adder 112. However, as described above, this increment would be on the critical path, and thus increase delay of the FMA unit 100. Accordingly, examples described herein complete the 2's complement on the post-normalized result as part of the rounding logic in the rounding unit 120. For example, the 2's complement can be completed on a post-normalized value by only incrementing the post-normalized value if the pre-normalized increment would have propagated through all of the bits reduced into the sticky bit, and the round bit. This condition occurs responsive to all of the bits reduced in the sticky calculation were asserted or 1, and the round bit is also asserted or 1. FIG. 9 is an example 900 of this condition being satisfied.

Figure 10:
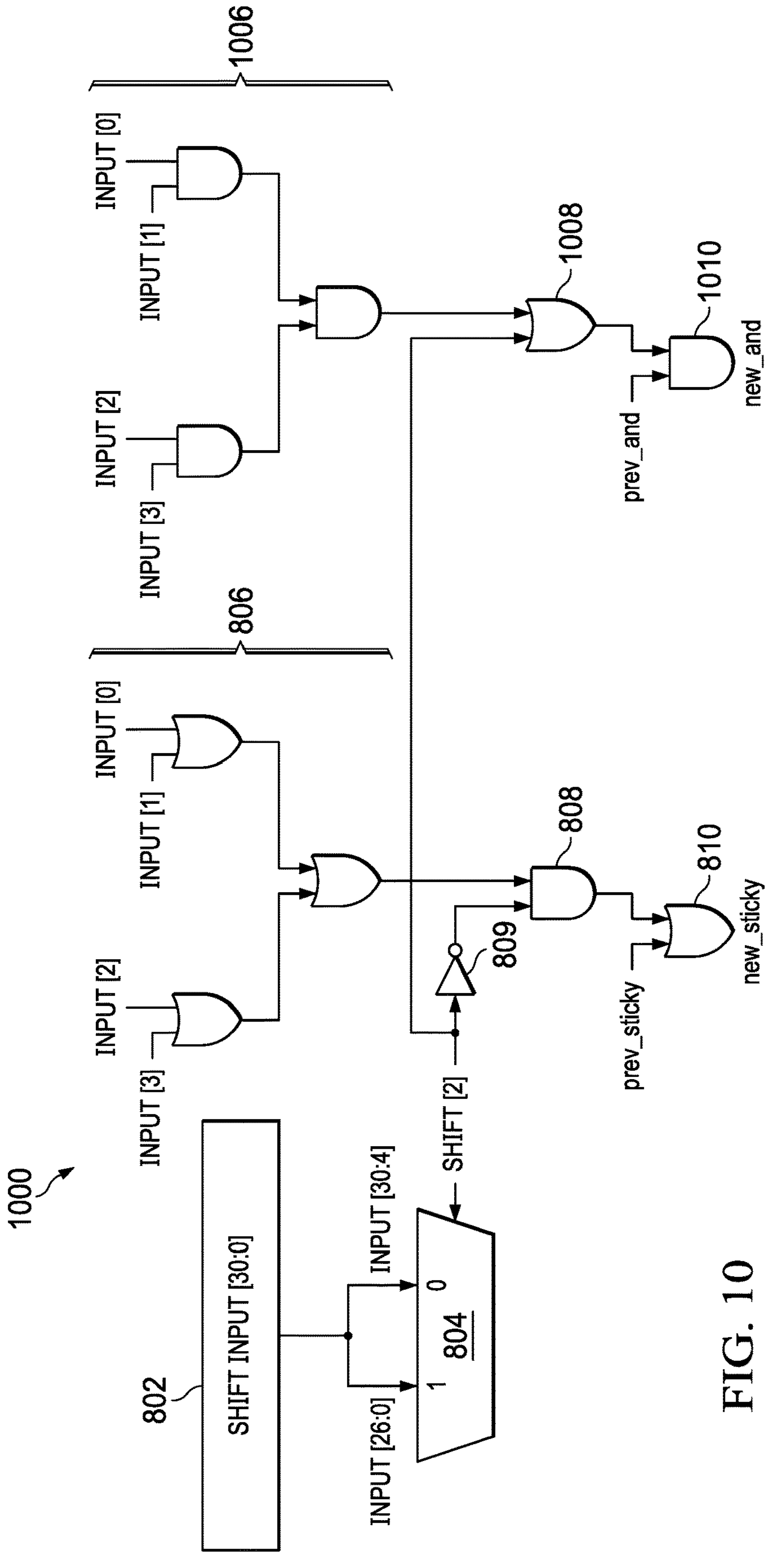
FIG. 10 is a schematic diagram of a circuit that is configured to provide a sticky bit and a ones bit in a FMA operation in accordance with various examples.

Accordingly, examples of this description include additional logic that is similar to the OR reduction 806, but performs an AND reduction on the LSBs less than the round bit from the normalizer 116. FIG. 10 is a schematic circuit diagram of logic 1000 that is configured to provide a sticky bit in a FMA operation, as described above, and also to provide an all_ones bit in the FMA operation in accordance with various examples. The logic 1000 is provided in parallel with (e.g., as a part of) the normalizer 116.

The logic 1000 includes the sticky logic 800 described above. For example, elements 802, 804, 806, 808, 809, and 810 are labeled in a like manner in FIG. 10, and function as described above in FIG. 8. Also similar to FIG. 8, in the example of FIG. 10, the logic 1000 is for one level of shifting, for a normalization shift of 4. In addition to providing the current stage's sticky calculation (or, when the current stage is a final shift stage, the sticky bit that is provided to the rounding select logic 704), the logic 1000 also provides the current stage's all_ones bit (or, when the current stage is the final shift stage, the all_ones bit that is provided to the rounding select logic 704).

For example, the inputs to the OR reduction network 806 are reused as inputs to an AND reduction network 1006. In this example, the AND reduction network 1006 thus receives input 802 bits 3-0 and provides an output that is the AND reduction of the input 802 bits 3-0.

An OR gate 1008 receives the output of the AND reduction network 1006 as a first input, and the input of the inverter 809 as a second input. An AND gate 1010 receives the output of the OR gate 1008 as a first input, and a previous shift stage all_ones calculation (labeled prev_AND). The output of the AND gate 1010 is the current stage's all_ones calculation (labeled new_AND) and, when the current stage is the final shift stage, the output of the AND gate 1010 is the all_ones bit that is provided to the rounding select logic 704.

In this example, responsive to the shift not being performed (e.g., shift is de-asserted, and the output of the inverter 809 is asserted), the input 802 bits 3-0 are discarded, and are thus used in the sticky calculation. The input 802 bits 3-0 are also reduced by the AND reduction network 1006. Because shift is de-asserted, if any of the input 802 bits 3-0 are 0, the output of the OR gate 1008 is also 0, which effectively kills the prev_AND signal and new_AND is 0. If all of the input 802 bits 3-0 are 1, the output of the OR gate 1008 is also 1, and thus new_AND will be equal to prev_AND. However, responsive to the shift being performed (e.g., shift is asserted, and the output of the inverter 809 is de-asserted), no bits are consumed by the sticky calculation, and the AND reduction network 1006 is effectively cancelled by being ORed with the shift signal, which is asserted in this case. Accordingly, responsive to the shift being performed, new_AND will be equal to prev_AND.

Referring again to FIG. 7, the rounding select logic 704 is configured to receive the round bit from the output of the normalizer 116 (e.g., the input to the rounding unit 120). The rounding select logic 704 is also configured to receive the sticky bit and the all_ones bit from the normalizer 116, such as provided by the logic 1000. The rounding select logic 704 is further configured to receive an indication of whether the result of the mantissa adder 112 was negative, and thus was 1's complemented. This indication is labeled 2s_comp, which is asserted responsive to the result of the mantissa adder 112 being negative, and is de-asserted responsive to the result of the mantissa adder 112 being positive.

The 2s_comp signal only indicates that the increment from completing the 2's complement could affect the rounded result of the rounding unit 120. Accordingly, additional signals are useful by the rounding select logic 704 to determine whether to select the incremented or non-incremented result using the mux 706. In the following expressions, Partial_2s_comp=2s_comp && all_ones; and Complete_2s_comp=round && partial_2s_comp In some examples, the rounding select logic 704 computes these additional, intermediate signals. In other examples, the normalizer 116 provides partial_2s_comp and complete_2s_comp to the rounding select logic 704 instead of the 2s_comp signal.

In accordance with examples of this description, in addition to rounding normally as described above, the rounding select logic 704 is also configured to select the incremented result when the 2's complement increment (e.g., plus one) would propagate through all of the sticky bits, and the round bit, into the LSB of the unrounded result from the normalizer 116.

In these examples, in which the 2's complement completion is merged with the rounding implemented by the rounding unit 120, the rounding select logic 704 implements one of the five rounding mode described above—RNE, RD, RPI, RNI, RMM—according to the following expressions:

RNE: round_up=(round||partial_2s_comp) && (LSB|| (sticky && ~(partial_2s_comp && ~round))) 1.

RD: round_up=complete_2s_comp 2.

RPI: round_up=(~sign||complete_2s_comp) && (round||sticky) 3.

RNI: round_up=(sign||complete_2s_comp) && (round||sticky) 4.

RMM: round_up=round||partial_2s_comp 5.

In the foregoing expressions, round is the round bit (e.g., the bit below the LSB of the unrounded result from the normalizer 116), sticky is the sticky bit, LSB is the LSB of the unrounded result from the normalizer 116, sign is the resulting floating point sign bit, and partial_2s_comp and complete_2s_comp are as expressed above.

In the foregoing expressions, depending on the particular rounding mode, the rounding decision implemented by the rounding unit 120 can be affected by the 2's complement increment even if the round bit is not asserted (e.g., complete_2s_comp is not true). The partial_2s_comp signal is thus useful to address this scenario. As described, partial_2s_comp is asserted responsive to the plus one from the 2's complement propagates through all of the sticky bits, but not necessarily the round bit. For example, if the round bit had been 0, partial_2s_comp being asserted indicates that the resultant round bit would be 1. Although the 2's complement plus one would not have propagated to the final mantissa result, the 2's complement plus one would have modified the round bit. As described above, depending on the rounding mode, the round bit going from 0 to 1 could change the rounding decision implemented by the rounding unit 120.

The RNE rounding mode provides a first example. In the updated expression, the round bit is ORed with partial_2s_comp, because partial_2s_comp would assert the round bit if it was originally 0. If the round bit is already 1, the entire expression should evaluate as true (e.g., produce a 1) because the 2's complement plus one propagates into the final result and should thus select the incremented value from the mux 706 as the rounded result.

The portion of the RNE updated expression (sticky && ~(partial_2s_comp && ~round)) is useful because if the partial_2s_comp condition occurs, then the 2's complement plus one propagates through all of the sticky bits. In this situation, the plus one propagating through the sticky bits would flip the sticky bits from 1s to 0s. In a case in which the round bit was 0 and partial_2s_comp is true, the round bit is asserted to 1, but the sticky bits are cleared or de-asserted to 0. Accordingly, rounding would only occur responsive to the current unrounded result being odd (e.g., LSB==1) because the exact value is tied between two values. However, in the case where complete_2s_comp is true, the rounded (e.g., incremented) value should be selected to complete the 2's complement. The additional (&& round) portion of the expression addresses this situation, because the RNE round_up expression will always evaluate to true responsive to complete_2s_comp being true.

Similar updates are made to the remaining rounding mode decisions. For example, the RD rounding mode does not round up in any situation. However, because the rounding unit 120 merges the 2's complement completion with rounding, the updated RD rounding mode expression results in "rounding up" (e.g., completing the 2's complement) responsive to complete_2s_comp being asserted.

As another example, the updated RPI and RNI rounding mode expressions are asserted responsive to complete_2s_comp being asserted, because complete_2s_comp being asserted indicates that sticky is also asserted.

As yet another example, the updated RMM expression is similar to the updated RNE expression, because the partial_2s_comp could assert the round bit, which should result in rounding up. Accordingly, the updated RMM expression is also asserted responsive to partial_2s_comp being asserted. Because partial_2s_complement is always asserted when complete_2s_comp is asserted, the updated RMM expression is also asserted responsive to complete_2s_comp being asserted.

For the above five rounding modes, there is no condition in which both rounding up and completing the 2's complement plus one propagation occur (e.g., there is not a case in which the unrounded mantissa result from the normalizer 116 is incremented twice). For example, when the 2's complement plus one propagates through the sticky bits and the round bit, then all of the sticky bits and the round bit become 0s. None of the original rounding expressions evaluates as true when both the round bit and sticky bit are 0. Additionally, complete_2s_comp being true effectively de-asserts the round bit and the sticky bit; thus, the result becomes exact, and rounding does not occur on exact results.

Accordingly, the rounding unit 120 and, in particular, the rounding select logic 704, enable multiple rounding modes to be merged with completing the 2's complement plus one operation. The 2's complement plus one (e.g., increment) is moved off of the critical path, and thus the rounding unit 120 reduces an overall delay of the FMA unit 100. Further, by reusing the incrementor 702 of the rounding unit 120 to complete the 2's complement, area savings can be realized relative to a FMA operation that completes a 2's complement with a separate incrementor circuit.

Figures 11, 15:
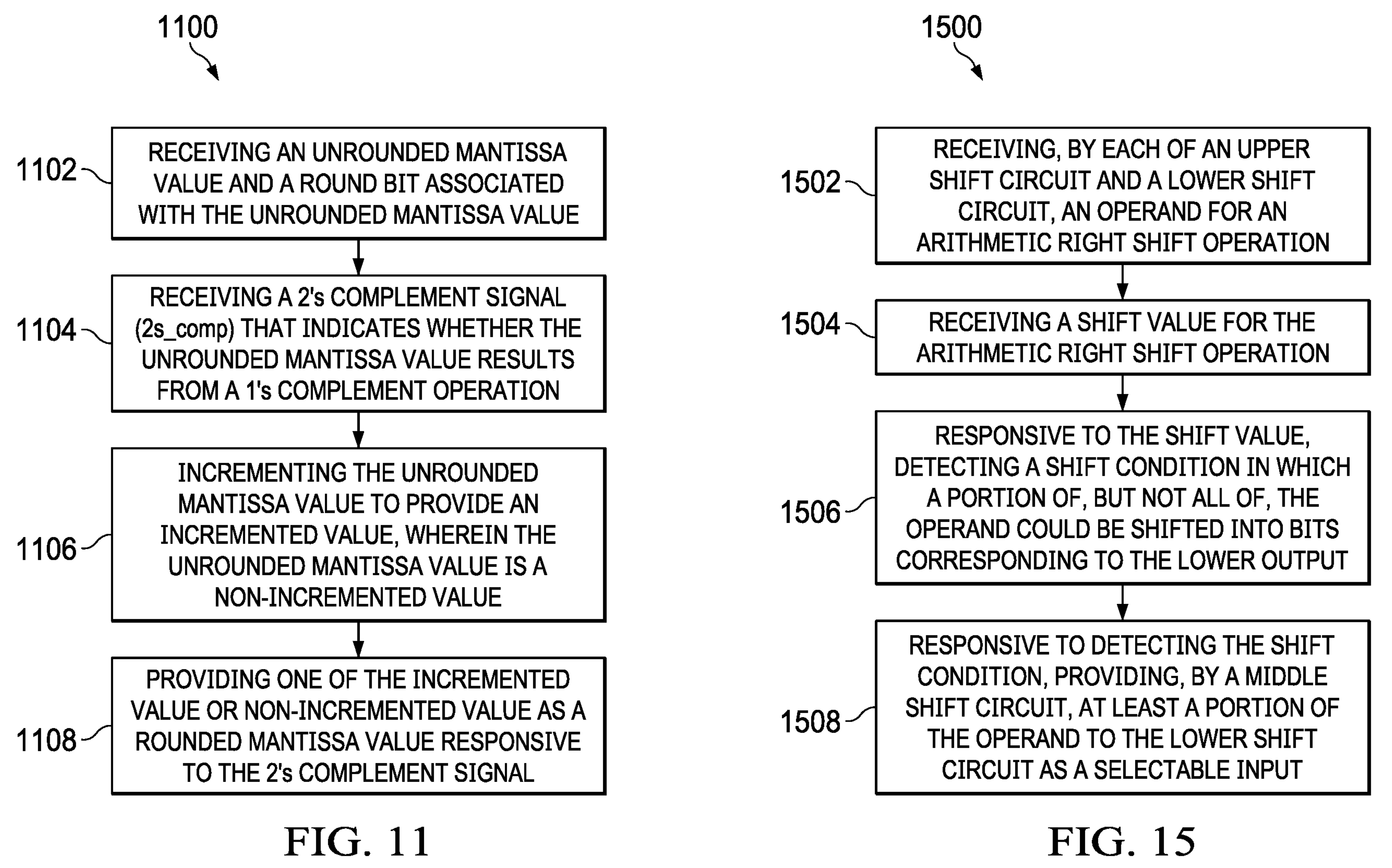
FIG. 11 is a flow chart of a method for merging a rounding and 2's complement plus one operation in accordance with various examples.
FIG. 15 is a flow chart of a method for performing an arithmetic right shift in accordance with various examples.

FIG. 11 is a flow diagram of a method 1100 for merging a rounding and 2's complement plus one operation in accordance with examples of this description. The method 1100 begins in block 1102 with receiving an unrounded mantissa value and a round bit associated with the unrounded mantissa value. For example, the rounding unit 120 is configured to receive the unrounded, normalized result from the normalizer 116. In an SP example, the rounding unit 120 thus receives 25 bits (e.g., the 24-bit unrounded mantissa plus the round bit) from the normalizer 116. In a DP example, the rounding unit 120 thus receives 54 bits (e.g., the 53-bit unrounded mantissa plus the round bit) from the normalizer 116.

The method 1100 continues in block 1104 with receiving a 2's complement signal (2s_comp) that indicates whether the unrounded mantissa value results from a 1's complement operation. For example, the rounding select logic 704 is configured to receive an indication of whether the result of the mantissa adder 112 was negative, and thus was 1's complemented. This indication is labeled 2s_comp, which is asserted responsive to the result of the mantissa adder 112 being negative, and is de-asserted responsive to the result of the mantissa adder 112 being positive.

The method 1100 continues further in block 1106 with incrementing the unrounded mantissa value to provide an incremented value, wherein the unrounded mantissa value is a non-incremented value. For example, the rounding unit

120 includes an incrementor 702 (e.g., a 24-bit incrementor to handle SP mantissas and/or a 53-bit incrementor to handle DP mantissas) that receives the unrounded mantissa value from the normalizer 116. The incrementor 702 provides an incremented value as its output.

The method 1100 then continues in block 1108 with providing one of the incremented value or non-incremented value as a rounded mantissa value responsive to the 2's complement signal. For example, the rounding unit 120 includes rounding select logic 704, which determines whether the rounding unit 120 provides an incremented (e.g., rounded up) or non-incremented (e.g., rounded down) result as its output. For example, the rounding select logic 704 is configured to provide an output round_up that is asserted responsive to a determination that the incremented output of the incrementor 702 is to be provided as the rounding unit 120 output, and is de-asserted responsive to a determination that the non-incremented output (e.g., the input to the incrementor 702) is to be provided as the rounding unit 120 output. The round_up signal is provided as a control signal to the mux 706, which is configured to provide non-incremented, unrounded mantissa result from the normalizer 116 responsive to round_up being 0, and to provide the incremented, rounded mantissa result from the incrementor 702 responsive to round_up being 1.

As described above, the 2's complement completion is merged with the rounding implemented by the rounding unit 120, and the rounding select logic 704 is configured to implement various rounding modes responsive to the 2s_comp signal, among others. Accordingly, the method 1100 enables multiple rounding modes to be merged with completing the 2's complement plus one operation. The 2's complement plus one (e.g., increment) is moved off of the critical path, thus reducing an overall delay of the FMA unit 100.

In addition to the above examples, in other examples of this description, the shift calculator 104 and/or the shifter 106 of the FMA unit 100 is configured to provide functionality that improves the efficiency and/or performance of FMA operations performed by the FMA unit 100. As in the above examples, certain of the following examples refer at times to various values having specific numbers of bits, for ease of explanation and/or to demonstrate various circuit functionality. However, the scope of this description is not limited to values having such specific numbers of bits unless explicitly stated. Further, in the following examples, reference is made to certain arrangements of logic gates and/or implementations of logical functions. However, such logical functions can be implemented differently in other examples (e.g., using different logic gates and/or combinations of logic gates), and the scope of this description is not limited to specific arrangements of logic gates unless explicitly stated.

As described above, particularly for floating point FMA operations, the C addend is shift-aligned to the product of the A*B multiplication so that C can be summed with the product of A*B. In examples described herein, the shifter 106 is configured to support both DP and dual SP FMA operations. For simplicity, DP FMA operations include shifting a DP operand or input (e.g., DP_in, having one implied bit and 52 mantissa bits), while dual SP FMA operations include shifting upper and lower SP operands or inputs (e.g., SP1_in and SP0_in, respectively, each having one implied bit and 23 mantissa bits). As described above, a DP FMA operation uses a 163-bit mantissa, while a SP FMA operation uses a 76-bit mantissa. Accordingly, to support both DP and dual SP FMA operations (e.g., for single-instruction, multiple-data (SIMD) architectures), the shifter 106 includes "upper" shift logic and "lower" shift logic. In one example, the lower shift logic is configured to provide a 76-bit output and the upper shift logic is configured to provide an 87-bit output. In this example, each of the lower shift logic and the upper shift logic provide a number of output bits that is at least the number of bits for a SP FMA operation. Further, the lower shift logic and the upper shift logic combined provide a number of output bits that is at least the number of bits for a DP FMA operation.

Generally, for a dual SP FMA operation, the upper shift logic performs shifting on the upper SP operand SP1_in, while the lower shift logic performs shifting on the lower SP operand SP0_in. For a DP FMA operation, the upper shift logic and lower shift logic function together to perform shifting on the DP_in operand. For ease of visualization, in FIGS. 12 and 13, the upper shift logic (e.g., upper shift circuit) is implemented as a left column of muxes and the lower shift logic (e.g., lower shift circuit) is implemented as a right column of muxes. Further, the shifter 106 includes a middle column of muxes to facilitate the DP FMA operation case in which bits are shifted from the upper shift circuit to the lower shift circuit.

Figure 12:
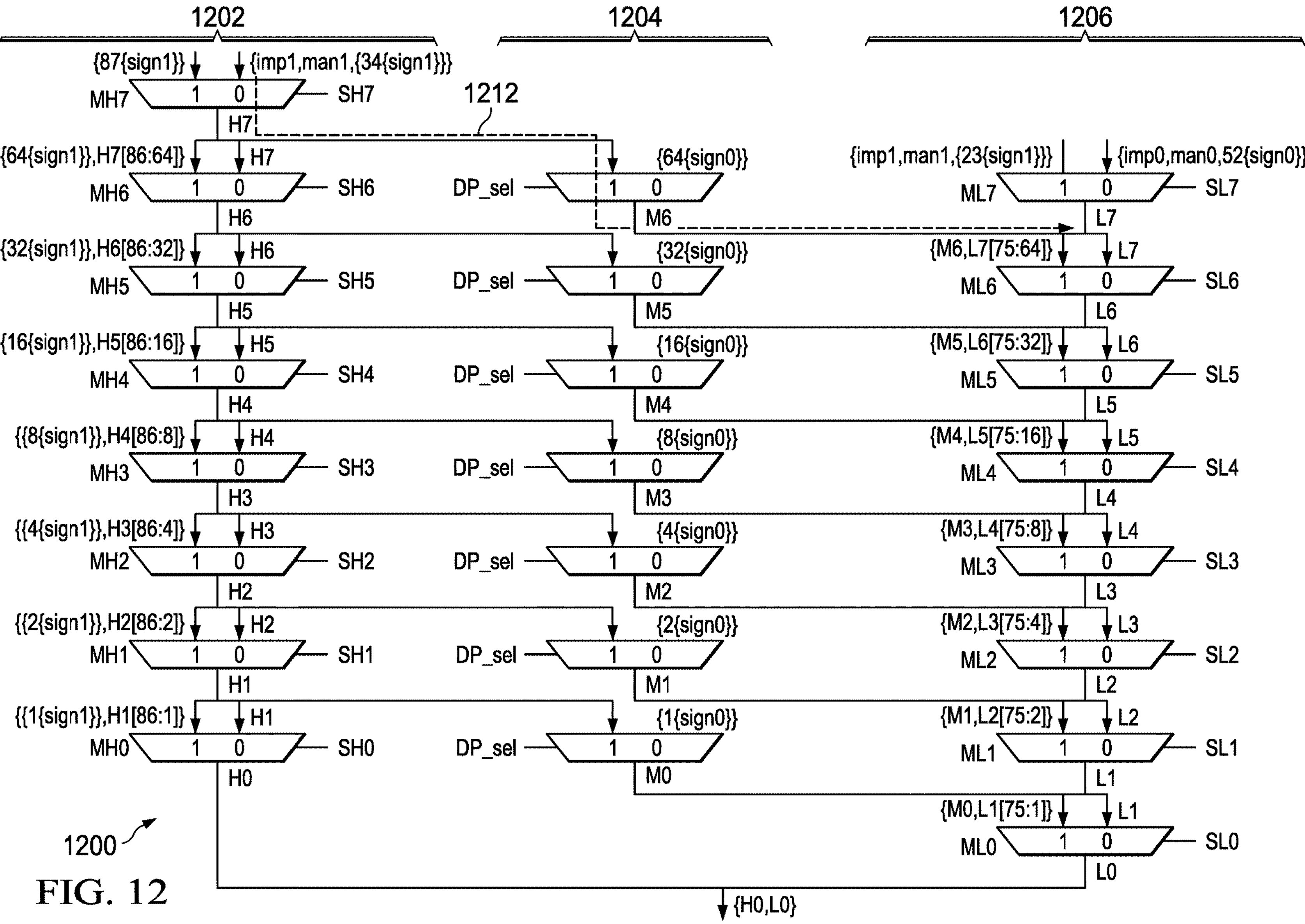
FIG. 12 is a schematic diagram of a circuit configured to implement both double precision and dual single precision arithmetic right shifts.

However, in some cases, an additional shift delay can exist between the upper shift circuit and the lower shift circuit responsive to shifting bits from the upper shift circuit, through the middle column of muxes, to the lower shift circuit in a DP FMA operation. For example, FIG. 12 is a schematic diagram of an arithmetic right shift circuit 1200 that is configured to implement both DP and dual SP arithmetic right shifts. The circuit 1200 includes a left column of muxes 1202 (also referred to as upper shift circuit 1202), a middle column of muxes 1204, and a right column of muxes 1206 (also referred to as lower shift circuit 1206). Generally, the left column of muxes 1202 implements the upper shift logic and the right column of muxes 1206 implements the lower shift logic. The middle column of muxes 1204 enables bits to be shifted from the upper shift circuit 1202 to the lower shift circuit 1206, such as in a DP FMA operation. The middle column of muxes 1204 shifts in sign bits to the lower shift circuit 1206 in a SP FMA operation.

In the example of FIG. 12, the upper shift circuit 1202 includes muxes MH7 through MH0, and the lower shift circuit 1206 includes muxes ML7 through ML0. Each of the muxes MH7 through MH0 provides a respective output H7 through H0, respectively. Each of the muxes ML7 through ML0 provides a respective output L7 through L0, respectively.

An upper shift value, represented by SH0 through SH7, is provided to the upper shift circuit 1202. In this example, the shift values are thus 8-bit vectors, where SH0 and SL0 represent bit 0 of the upper and lower shift values, respectively, and SH7 and SL7 represent bit 7 of the upper and lower shift values, respectively. The bits of the shift values are the control signals provided to a corresponding mux in the upper shift circuit 1202 and the lower shift circuit 1206. For example, SH7 is the control signal for MH7, SL7 is the control signal for ML7, and so forth.

In FIG. 12 (and FIG. 13, described below), a Verilog-type syntax illustrates concatenation used to form various input vectors. For example, terms inside of { } separated by commas are concatenated into a single vector. The circuit 1200 is configured to receive as inputs imp1, man1, imp0, man0, and DP_sel. Imp1 is a single bit that is the implied bit for the upper single precision operand (SP1_in) or for the double precision operand DP_in. Imp0 is a single bit that is the implied bit for the lower single precision operand (SP0_in). Man1 is a 52-bit vector that is the DP_in mantissa or the 23-bit SP1_in mantissa padded with 29 sign bits padded in the LSB portion. Man0 is a 23-bit vector that is the SP0_in mantissa. The sign bit for SP1_in or DP is sign1, and the sign bit for SP0_in is sign0. DP_sel indicates whether a DP operation is being performed, and is asserted responsive to a DP operation being performed, and de-asserted responsive to a dual SP operation being performed. The circuit 1200 also receives the upper shift value SHx and the lower shift value SLx. In some examples, SLx=SHx for a DP shift operation.

Each level of mux in the upper shift circuit 1202 and the lower shift circuit 1206 is configured to implement a decreasing power of two shift. For example, responsive to SH6 being asserted, MH6 provides the previous level output H7, shifted to the right by 64, as H6; responsive to SH6 being de-asserted, MH6 passes through the previous level output H7 as H6. MH5 functions similarly responsive to SH5, except that the right shift amount is 32, while MH4 provides a right shift amount of 16, and so on through MH0 providing a right shift amount of 1.

The muxes of the lower shift circuit 1206 function similarly responsive to the lower shift value SLx, except that responsive to a signal SLx being asserted, the corresponding mux MLx brings in a number of bits from the middle column of muxes 1204. For a dual SP shift operation, the middle column of muxes 1204 provides sign bits to the lower shift circuit 1206. For a DP shift operation, the middle column of muxes 1204 facilitates bits being shifted out of the upper shift circuit 1202 into the lower shift circuit 1206. In some examples, sign0=sign1 for a DP shift operation.

The circuit 1200 thus reduces area by reusing logic to implement arithmetic right shifts for both DP shift operations and dual SP shift operations, which is useful in a SIMD architecture. However, although the circuit 1200 reduces area, the middle column of muxes 1204 adds a mux on the critical path (e.g., introducing an additional delay) to allow bits to shift from the upper shift circuit 1202 to the lower shift circuit 1206 for DP shift operations. For example, as indicated by arrow 1212, the output of SH7 (H7) is delayed by the middle column of muxes 1204 before being provided to ML6 for further shifting by the lower shift circuit 1206.

Figure 13:
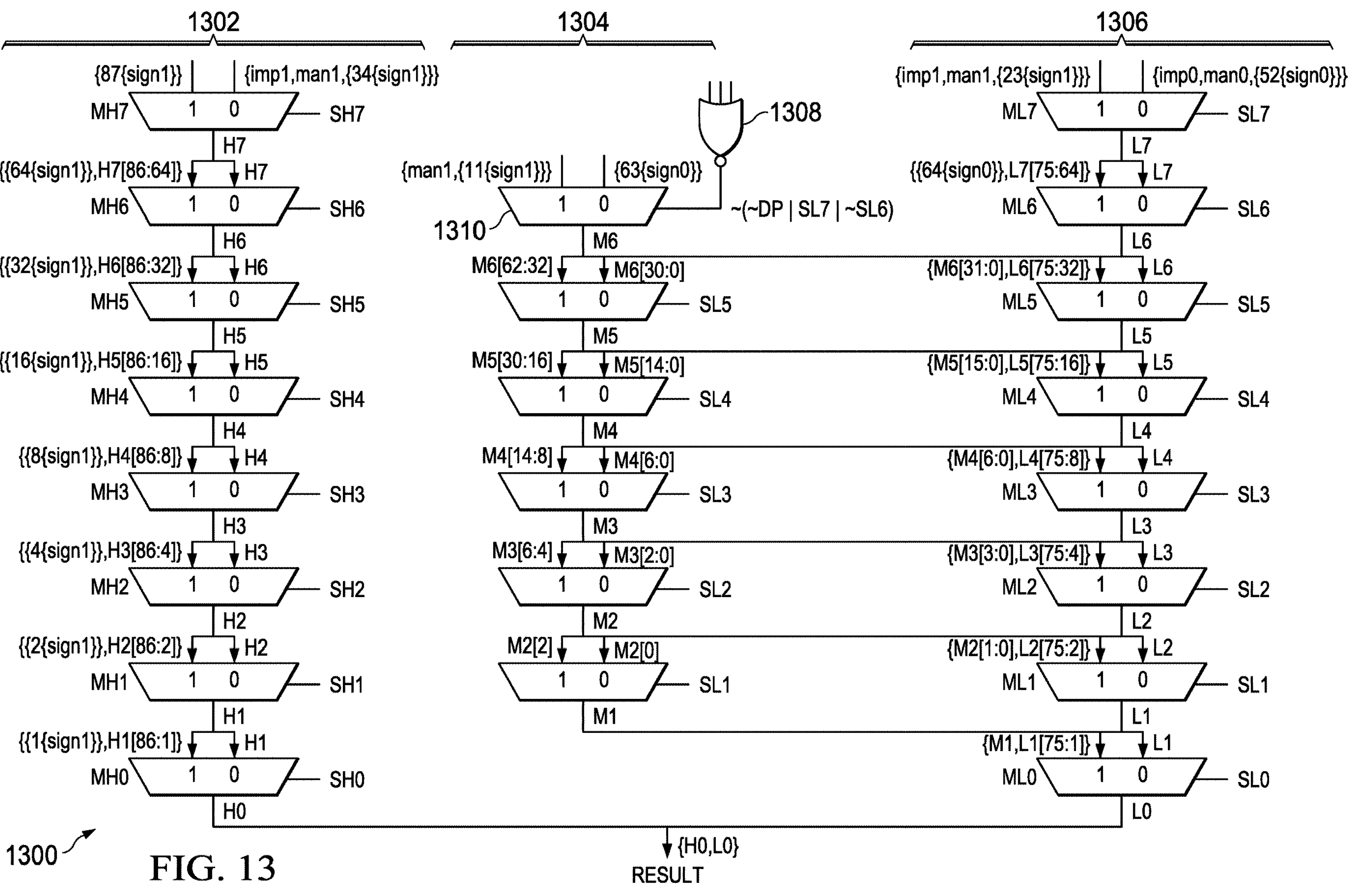
FIG. 13 is a schematic diagram of a circuit configured to implement both double precision and dual single precision arithmetic right shifts with reduced delay in accordance with various examples.

Examples of this description address the foregoing by detecting whether bits are passed from upper shift circuit to lower shift circuit (e.g., in a DP shift operation) and providing appropriate input and control signal values via a path that does not include the upper shift circuit. FIG. 13 is a schematic diagram of an arithmetic right shift circuit 1300 that is configured to implement both DP and dual SP arithmetic right shifts. Unlike the circuit 1200, however, the arithmetic right shift circuit 1300 of FIG. 13 is configured to detect the right shift case in which bits are or could be passed from upper shift circuit to lower shift circuit. Accordingly, the right shift circuit 1300 is configured to reduce the delay described above, which results from bits being shifted from upper shift circuit 1202 to lower shift circuit 1206 through the middle column of muxes 1204.

The right shift circuit 1300 is also arranged into a left column of muxes 1302 (also referred to as upper shift circuit 1302), a middle column of muxes 1304 (also referred to as a middle shift circuit) 1304, and a right column of muxes 1306 (also referred to as lower shift circuit 1306). Similar to as described with respect to FIG. 12, the upper shift circuit 1302 is controlled by SHx, and the lower shift circuit 1306 is controlled by SLx. The upper shift circuit 1302 provides the 87 MSBs of a double precision result, while the lower shift circuit 1306 provides the 76 LSBs of the double precision shift result (e.g., useful for a DP FMA operation).

In FIG. 13, the middle shift circuit 1304 is also controlled by SLx (unlike the middle column 1204 in FIG. 12, which is controlled by DP_sel, which indicates whether the shift operation is a DP shift operation). In a DP shift operation, the middle shift circuit 1304 provides bits that are shifted from the upper shift circuit 1302 to the lower shift circuit 1306. As in FIG. 12, the circuit 1300 is also configured to perform dual SP shift operations, in which the middle shift circuit 1304 provides sign bits to be shifted into the lower shift circuit 1306. For dual SP shift operations, the arithmetic shift for SP1_in is performed by the upper shift circuit 1302, while the arithmetic shift for SP0_in is performed by the lower shift circuit 1306 (with sign bits provided by the middle shift circuit 1304). Thus, for the sake of brevity, the following examples are described primarily with respect to a DP shift operation, because the circuit 1300 reduces the delay described above with respect to FIG. 12, which is caused by bits being shifted from upper shift circuit 1202 to lower shift circuit 1206 through the middle column of muxes 1204 in a DP shift operation.

In some examples, detecting the shift case where bits are passed from upper shift circuit 1302 to lower shift circuit 1306 is facilitated by using an input width that is at most half of the output width. Accordingly, for the sake of illustration, the 53-bit DP input (imp1 plus 52 man1 bits) can be considered as 64 bits, and the 87-bit output of the upper shift circuit 1302 can be considered as being 128 bits. More generally, the input and output widths are rounded up to the next power of two (if either is not already a power of two). When considering the input and output sizes having this relation, the case in which the input to the upper shift circuit 1302 will be, or could be, passed or shifted to the lower shift circuit 1306 is when the largest shift bit is 0 (indicating no corresponding shift is performed), and the next-largest shift bit is 1 (indicating that the corresponding shift is performed).

Figure 14:
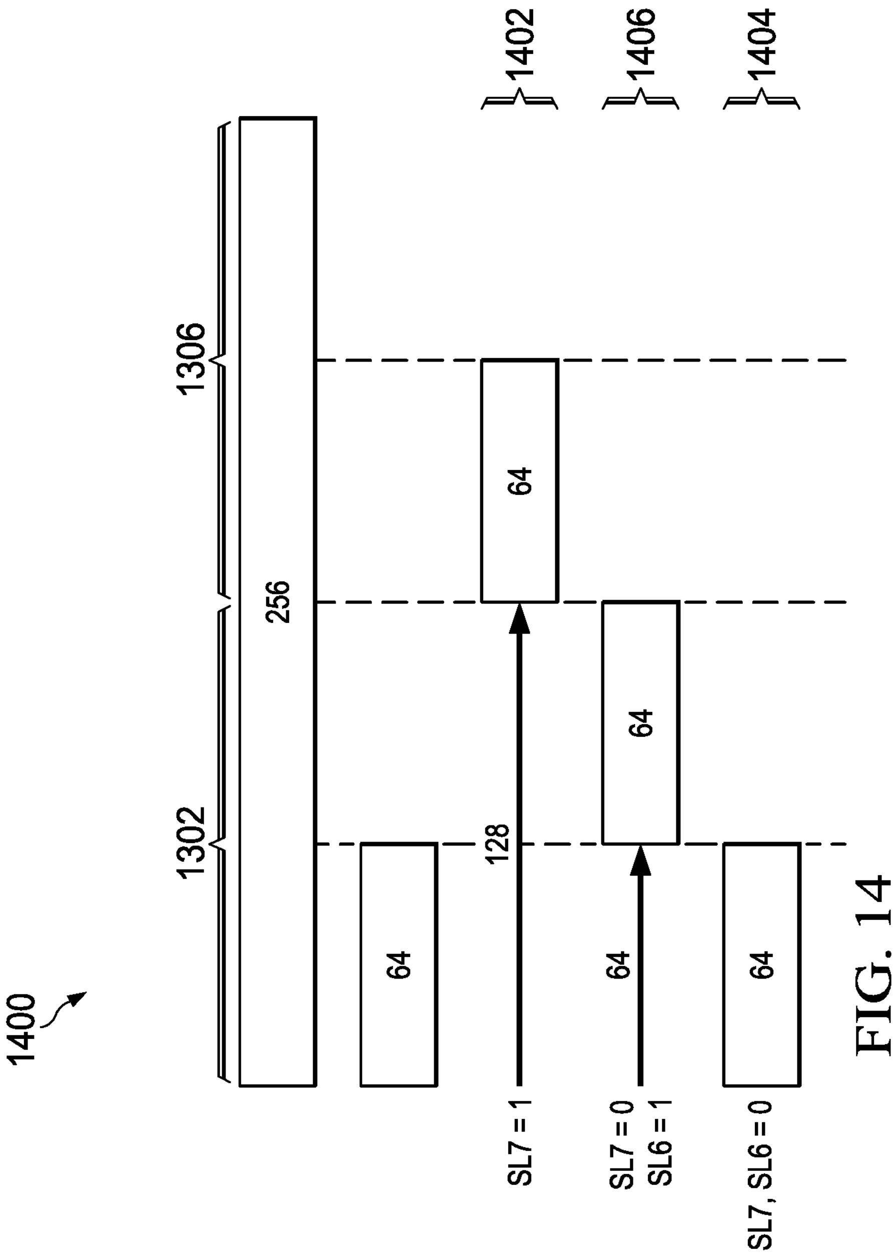
FIG. 14 is an example of various arithmetic right shift operations to demonstrate the functionality of the arithmetic right shift circuit of FIG. 13 in accordance with various examples.

FIG. 14 is an example 1400 of various arithmetic right shift operations to demonstrate the functionality of the arithmetic right shift circuit 1300 of FIG. 13 in accordance with various examples. In particular, the numerical examples above are continued, in which the input is 64 bits, and the output of the upper shift circuit 1302 is 128 bits. For the sake of generality, the upper shift circuit 1302 and the lower shift circuit 1306 each includes N=8 levels of muxes. An output width of each of the upper shift circuit 1302 and the lower shift circuit is $2^{N-1}$=128 bits. Accordingly, each of the upper shift circuit 1302 and the lower shift circuit 1306 can receive an input of up to $2^{N-2}$=64 bits (e.g., half of the output width of the respective shift circuit). The output of the right shift circuit 1300 can be up to $2^{N}$=256 bits. Accordingly, for a DP shift operation, the DP_in operand is provided to the upper shift circuit 1302 and can be shifted up to $2^{N}-1$=255 bits. For a dual SP shift operation, the SP1_in operand is provided to the upper shift circuit 1302 and can be shifted up to $2^{N-1}-1$=127 bits, and the SP0_in operand is provided to the lower shift circuit 1306 and can be shifted up to $2^{N-1}-1$=127 bits (e.g., SH7 and SL7 are not used for SP shift operations). The following examples refer to DP shift operations.

In a first example 1402, if the largest shift bit is 1 (e.g., SL7=1), then no bits will be passed from the upper shift circuit 1302 to the lower shift circuit 1306, because the first level of muxes shifts the entire 64-bit input from the upper shift circuit 1302 to the lower shift circuit 1306 (e.g., ML7 provides the DP_in value, with LSB padding, as its output L7). That is, subsequent shifts (if any) occur entirely in the lower shift circuit 1306.

In a second example 1404, the largest two shift bits are 0 (e.g., SL7=0, and SL6=0). In the second example 1404, no bits can be passed from the upper shift circuit 1302 to the lower shift circuit 1306, because the largest possible remaining shift is $2^{N-2}-1$ (e.g., 63 bits in this specific example). Considering the example input size of $2^{N-2}$ (e.g., 64 bits), and the upper shift circuit 1302 output width of $2^{N-1}$ (e.g., 128 bits), even the maximum remaining shift will contain the input bits to the upper shift circuit 1302 output.

Accordingly, in a third example 1406, the largest shift bit is 0 (e.g., SL7=0) and the next-largest shift bit is 1 (e.g., SL6=1). As described, this is the only case in which the input bits could be shifted from the upper shift circuit 1302 to the lower shift circuit 1306, such as by subsequent (e.g., visually lower) layers of the middle shift circuit 1304.

Referring again to FIG. 13, the third example 1406 condition is detected by a NOR3 gate 1308 that provides control signal to the top or first mux 1310 in the middle shift circuit 1304. In particular, the NOR3 gate 1308 receives ~DP_sel, SL7, and ~SL6 as inputs and provides an output according to the expression ~(~DP_sel||SL7||~SL6). Accordingly, the first mux 1310 only provides man1 (with sign1 LSB padding) as its output responsive a DP shift operation being performed, SL7=0, and SL6=1. In all other cases, the first mux 1310 provides sign0 bits as its output. In an example, the first mux 1310 does not provide the implied bit imp1 (e.g., along with man1 and sign1 LSB padding) as its output, because man1 and the 11 bits of sign padding represent 63 bits, which is also the maximum remaining shift (e.g., responsive to SL5 through SL0 being asserted) that the output of the first mux 1310 can be subject to. Accordingly, even if provided as part of the output M6, imp1 cannot be shifted into the lower shift circuit 1306, and thus the width of the first mux 1310 can be reduced by not including imp1.

In some examples, to facilitate SIMD functionality of the circuit 1300, for a DP shift operation, sign0 is set to be equal to sign1, and imp0 and man0 are replaced with sign1 bits. For a lone SP shift operation, sign1, imp1 and man1 do not need to be replaced because it will not be selected because SL7 cannot be asserted for SP shift operations (e.g., SL7 would produce too large of a shift for a SP shift operation).

As described above, the circuit 1300 is configured to receive two shift values as inputs, SHx and SLx. SHx is the upper shift value, which contains N bits for N shift levels. SLx is the lower shift value, which also contains N bits for N shift levels. In the example of FIG. 13, N=8. SHx corresponds to the shift amount for either the SP1_in operand or the DP_in operand. SLx corresponds to the shift amount for either the SP0_in operand or an offset shift amount for the DP_in operand.

For example, in a DP shift operation, SLx is equal to SHx plus a shift offset, and thus SLx is an offset shift amount. The shift offset is determined responsive to the actual vector width of the upper shift circuit 1302 output. In the specific example of FIG. 13, the overall output of the circuit 1300 is a 163-bit vector, with the upper shift circuit 1302 output providing the upper 87 bits, and the lower shift circuit 1306 providing the lower 76 bits. Accordingly, for this example, the shift offset is determined as $2^{N-1}$ minus the width of the upper shift circuit 1302 output (e.g., 128−87=41 for the specific example of FIG. 13).

The shift offset is useful to more easily detect an 87-bit shift. For example, if SHx is greater than or equal to 87, then SLx is greater than or equal to 128 (e.g., 87+41=128), and thus SL7 is asserted). Because the width of the upper shift circuit 1302 is 87 bits, SHx being greater than or equal to 87 corresponds to the input bits (e.g., imp1 and man1) being shifted completely out of the upper shift circuit 1302. That is, subsequent shifts (if any, due to SHx being greater than 87) occur entirely in the lower shift circuit 1306, which is the condition demonstrated in example 1402.

The shift offset is also useful to more easily detect a 23-bit shift. For example, if SHx is less than 23, then SLx is less than 64 (e.g., 23+41=64), and thus SL6 is not asserted. Because the input bits to the upper shift circuit 1302 include 34 sign-padded bits as LSBs, SHx being less than 23 indicates that even the largest possible remaining shift amount will not shift the input bits (e.g., imp1 and man1) into the lower shift circuit 1306, which is the condition demonstrated in example 1404. That is, any shift of less than 23 only shifts sign bits into the lower shift circuit 1306.

In cases where SHx is greater than or equal to 23, and less than 87, SL6 is asserted and SL7 is not asserted, which is the condition demonstrated in example 1406. SHx shift values in this range could result in bits being shifted from the upper shift circuit 1302 into the lower shift circuit 1306. Accordingly, including the shift offset in SLx for DP shift operations facilitates the circuit 1300 detecting the cases for a non-perfect power of two output width (e.g., of the upper shift circuit 1302) that are equivalent to those in examples 1402 (SHx greater than or equal to 87), 1404 (SHx less than 23), and 1406 (SHx greater than or equal to 23, and less than 87), described with respect to FIG. 14.

The remaining SLx values applied to the lower shift circuit 1306 are corrected to provide the proper shift output, even though the shift offset was added to SHx to provide SLx. For example, SL7 effectively performs an 87-bit shift because, responsive to SL7 being asserted, the DP input (e.g., imp1, man1, and padding bits) is provided as the ML7 mux output L7. Accordingly, the offset is effectively subtracted responsive to SL7 being asserted and only performing an 87-bit shift, rather than a 128-bit shift, so that subsequent SLx shifts are the proper amount (e.g., so that the final shift is by the value specified by SHx, not including the added offset to SLx).

In another example, when SL7 is not asserted, SL6 being asserted (e.g., the output of NOR3 gate 1308 being asserted) effectively performs a 23-bit shift, because the mux 1310 selects the DP input with 23 fewer sign-padded bits (e.g., 11{sign1} instead of 34{sign1} as provided to the MH7 mux) as the output M6. Accordingly, subsequent SLx shifts are by the proper amount because the offset is effectively subtracted by the mux 1310 responsive to SL7 being de-asserted and SL6 being asserted.

Finally, when neither SL7 nor SL6 are asserted, the lower shift circuit 1306 is expected to provide all sign bits. Irrespective of the value of the remainder of SLx, the ML7 and ML6 muxes provide sign bits as the outputs L7, L6, respectively, responsive to SL7 and SL6 being de-asserted. The mux 1310 also provides all sign bits as its output M6. Accordingly, the output of the lower shift circuit 1306 is properly all sign bits in this case in which SL7 and SL6 are de-asserted.

In a first illustrative example, the right shift circuit 1300 performs a DP shift operation, and SHx is equal to 100. As described above, in the example in which the upper shift circuit 1302 is 87 bits wide, SLx is equal to SHx plus a shift offset of 41, or 141. Because the upper shift circuit 1302 is 87 bits wide, SHx being equal to 100 causes the upper shift circuit 1302 to shift out the input bits so that the output of the upper shift circuit 1302 (e.g., H0) only contains shifted in sign bits. Referring to the lower shift circuit 1306, SLx being equal to 141 results in SL7 (e.g., shift by 128) being true or asserted. ML7 aligns the 53-bit input (e.g., imp1 and man1) with the MSBs of the lower shift circuit 1306, effectively implementing an 87-bit shift as described above, cancelling the offset of 41. Further, a shift of 13 is implemented by the remainder of SLx (e.g., 141−128 implemented by SL7 being true). Thus, the remainder of the lower shift circuit 1306 shifts the output of ML7, L7, by 13 bits, which are shifted in sign bits from the middle shift circuit 1304. The output of the lower shift circuit 1306 (e.g., L0) is thus 13 shifted in sign bits, the 53-bit input, with the LSBs being padded sign bits. Responsive to H0 and L0 being concatenated as the final result of the right shift circuit 1300, the final result contains 100 sign bits (e.g., 87 sign bits from H0, and 13 sign bits from the MSBs of L0), the 53-bit input, and padded sign bits. Accordingly, the final result is shifted by 100 bits according to the value of SHx.

In a second illustrative example, the right shift circuit 1300 performs a DP shift operation, and SHx is equal to 10. As described above, in the example in which the upper shift circuit 1302 is 87 bits wide, SLx is equal to SHx plus a shift offset of 41, or 51. SHx being equal to 10 causes the upper shift circuit 1302 to shift in 10 sign1 bits so that H0 contains 10 sign bits, the 53-bit input, and padded sign bits. Referring to the lower shift circuit 1306, SLx being equal to 51 results in SL7 and SL6 (e.g., shift by 128 or 64) being false or de-asserted. The lower shift circuit 1306 thus does not use any bits from the upper half (e.g., the input to shift circuit) and provides the output L0 as padded sign bits (e.g., either shifted in sign bits from the middle shift circuit 1304, or sign bits from the lower shift circuit 1306 due to sign0 being equal to sign1, and imp0 and man0 being replaced with sign1 bits for a DP shift operation). The final result of the right shift circuit 1300 includes 10 sign bits shifted in by the upper shift circuit 1302, the 53-bit input, and padded sign bits. Accordingly, the final result is shifted by 10 bits according to the value of SHx.

In a third illustrative example, the right shift circuit 1300 performs a DP shift operation, and SHx is equal to 40. As described above, in the example in which the upper shift circuit 1302 is 87 bits wide, SLx is equal to SHx plus a shift offset of 41, or 81. Because the upper shift circuit 1302 is 87 bits wide, SHx being equal to 40 causes the upper shift circuit 1302 to shift out some of the input bits (e.g., the 6 LSBs of man1 in addition to the 34 sign1 bits), which should thus be provided to the lower shift circuit 1306. The output of the upper shift circuit 1302 (e.g., H0) is thus 40 shifted in sign1 bits followed by the 47 MSBs of imp1 and man1, while the 6 LSBs and the 34 sign1 bits are shifted out of the upper shift circuit 1302 responsive to the shift of 40.

Referring to the lower shift circuit 1306, SLx being equal to 81 results in SL7 being false, or de-asserted, and SL6 being true, or asserted. This is the condition detected by the NOR3 gate 1308, which asserts its output in response and causes the first MUX 1310 to provide the 52-bit man1 value and 11 sign1 bits as its output M6. As described, M6 includes 23 fewer sign1 bits than the input to the mux MH7, which includes 34 sign1 bits, and thus effectively implements a 23-bit shift responsive to SL6 being asserted (e.g., instead of a 64-bit shift), cancelling the offset of 41 as described above. Further, a shift of 17 is implemented by the remainder of SLx (e.g., 81−64 implemented by SL6 being true), and thus SL4 (e.g., a shift of 16) and SL0 (e.g., a shift of 1) are asserted.

SL4 being asserted causes the mux ML4 to provide {M5[15:0],L5[75:16]} as its output L4. M5[15:0] includes the 5 LSBs of man1 followed by 11 sign1 bits, while L5[75:16] includes 60 sign1 bits. In this example, L1=L2=L3=L4 because SL1−SL3=0. SL0 being asserted causes the mux ML0 to provide {M1,L1[75:1]} as its output. M1 includes the next-most LSB of man1 (e.g., due to SL4 causing M4 to be equal to M5[30:16], where M5[15] was the MSB provided for L4), while L1[75:1] includes the 5 LSBs of man1 followed by 70 sign1 bits. The output of the lower shift circuit 1306 (e.g., L0) thus includes 6 LSBs of man1, followed by padded sign bits. Responsive to H0 and L0 being concatenated as the final result of the right shift circuit 1300, the final result contains 40 sign bits shifted in by the upper shift circuit, the 47 MSBs of imp1 and man1 (e.g., from H0, the 6 LSBs of man1 (e.g., from L0), and padded sign bits. Accordingly, the final result is shifted by 40 bits according to the value of SHx.

In this third illustrative example, because the first MUX 1310 is controlled responsive to the condition in which bits can be shifted from upper shift circuit 1302 to lower shift circuit 1306 (e.g., detected by NOR3 gate 1308, ~(~DP||SL7||~SL6)), the delay introduced by passing bits from the upper shift circuit, through the middle column of muxes, to the lower shift circuit, such as in FIG. 12, is avoided. For example, in FIG. 12 the output of SH7 (H7) is delayed by the middle column of muxes 1204 before being provided to ML6 for further shifting by the lower shift circuit 1206. However, in accordance with examples of this disclosure, the middle shift circuit 1304 provides man1 input bits responsive to the output of NOR3 gate 1308 being asserted without introducing such delay.

In some cases, the upper shift circuit 1302 has a width of less than or equal $2^{N-1}$, as described above. In the particular example of FIG. 13, the width of the upper shift circuit 1302 can thus remain as 87 bits, while the width of the lower shift circuit 1306 can thus remain as 76 bits. Accordingly, the right shift circuit 1300 is configured to perform both DP shift operations and dual SP shift operations. In some examples, the width of the middle shift circuit 1304 can change at each level, such as to reduce area needed to implement the middle shift circuit 1304. For example, the width of the middle shift circuit 1304 changes at each level responsive to the maximum remaining shift at that level. The width of the first level of middle shift circuit 1304 (e.g., the mux 1310) is $2^{N-2}-1=63$, because the maximum remaining shift responsive to the mux 1310 output M6 is 63 bits. The maximum remaining shift decreases by a power of two at each successive level. Accordingly, the width of the middle shift circuit 1304 can be given by $2^{N-M-2}-1$, where N is the number of shift levels (e.g., the number of levels in upper shift circuit 1302 and lower shift circuit 1306), and M is the number of previous middle logic levels. The following table demonstrates the width of the different levels of the middle shift circuit 1304 in the example of FIG. 13:

| Level | N | M | Middle Logic Width |
|---|---|---|---|
| 6 (e.g., 1310) | 8 | 0 | 63 |
| 5 | 8 | 1 | 31 |
| 4 | 8 | 2 | 15 |
| 3 | 8 | 3 | 7 |
| 2 | 8 | 4 | 3 |
| 1 | 8 | 5 | 1 |

In some examples, the shift calculator 104 is configured to provide the offset to be added to SHx to produce the offset shift value SLx value during DP shift operations. For example, the shift calculator 104 can be configured to provide an exponent bias constant during SHx and SLx computation. Accordingly, the shift calculator 104 can be configured to modify the bias constant value used during the SLx computation to contain the additional offset (e.g., plus 41 in the example described above) for DP shift operations.

FIG. 15 is a flow chart of a method 1500 for performing an arithmetic right shift in accordance with examples of this description. The method 1500 begins in block 1502 with receiving, by each of an upper shift circuit and a lower shift circuit, an operand for an arithmetic right shift operation. For example, the operand includes man1 (and, optionally, imp1) in the DP shifting operation described above. The upper shift circuit 1302 receives the operand as an input to mux MH7, while the lower shift circuit 1306 receives the operand as an input to mux ML7. The upper shift circuit 1302 is configured to provide an upper output (e.g., H0) and the lower shift circuit 1306 is configured to provide a lower output (e.g., L0). A result of the arithmetic right shift operation (e.g., the output of the right shift circuit 1300) is H0 concatenated with L0, as shown in FIG. 13.

The method 1500 continues in block 1504 with receiving a shift value for the arithmetic right shift operation. For example, SHx and SLx are received by the right shift circuit 1300 (e.g., the arithmetic shifter 106) from the shift calculator 104. In some examples, such as where the width of the upper shift circuit 1302 output is a power of two, SLx is equal to SHx. However, in other examples in which the width of the upper shift circuit 1302 is not a power of two, SLs is equal to SHx plus an offset (e.g., SLx is an offset shift value). As described above, the offset is equal to the difference between the width of the upper shift circuit 1302 and the next-greatest power of two.

The method 1500 continues in block 1506 with detecting a shift condition responsive to the shift value. The shift condition is a condition in which a portion of, but not all of, the operand could be shifted into bits corresponding to the lower output (e.g., L0). The shift condition is the condition demonstrated in example 1406, in which additional shifting would shift input (e.g., operand) bits into the lower output. By contrast, in example 1402, the initial shift shifts all input bits into the lower output, and so subsequent shifts (if any) do not shift input bits from the upper shift circuit 1302 to the lower shift circuit 1306. Further, in example 1404, the largest remaining shift value is insufficient to shift input bits into the lower output, and so again, subsequent shifts (if any) do not shift input bits from the upper shift circuit 1302 to the lower shift circuit 1306. In some examples, the shift condition is detected responsive to a MSB of the shift value or the offset shift value (e.g., SLx) being de-asserted, and a next MSB of the shift value or the offset shift value (e.g., SLx) being asserted. In other examples, the shift condition is also detected responsive to the operand being a double precision operand (e.g., the shift operation being performed is a DP shift operation). As described, the NOR3 gate 1308 detects the shift condition, and the middle shift circuit 1304 is controlled responsive to the output of the NOR3 gate 1308.

The method 1500 thus continues in block 1508, responsive to detecting the shift condition, with providing (e.g., by the middle shift circuit 1304) at least a portion of the operand to the lower shift circuit 1306 as a selectable input. For example, responsive to the output of the NOR3 gate 1308 being asserted (e.g., the shift condition being detected), the first mux 1310 of the middle shift circuit 1304 provides the operand man1 as its output M6, which is selectable by the mux ML5 of the lower shift circuit 1306. As described above, this reduces or eliminates the delay associated with passing bits from the upper shift circuit, through the middle column of muxes, to the lower shift circuit, such as in FIG. 12. Responsive to the output of the NOR3 gate 1308 being de-asserted (e.g., the shift condition not being detected), the first mux 1310 of the middle shift circuit 1304 provides the sign bits as its output M6, which are selectable by the mux ML5 of the lower shift circuit 1306.

As described above, SHx is a shift value that is provided as a control signal to the upper shift circuit 1302. SLx is a shift value that is provided as a control signal to the lower shift circuit 1306, and at least a portion of SLx is provided as a control signal to the middle shift circuit 1304. For dual SP shift operations, SHx is useful to control the upper shift circuit 1302 to perform an arithmetic right shift on a first SP operand (e.g., man1), and SLx is useful to control the lower shift circuit 1306 to perform an arithmetic right shift on a second SP operand (e.g., man0).

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A method, comprising:

generating a sum by an adder;

incrementing, by a first incrementor, a first set of data to provide an incremented first set of data;

selecting, by a first multiplexor, one of the first set of data and the incremented first set of data as a set of selected bits based on a specified precision type;

generating, by the adder, an unrounded mantissa value comprising the sum and the set of selected bits based on the specified precision type;

receiving the unrounded mantissa value and a round bit associated with the unrounded mantissa value;

receiving a 2's complement signal that indicates whether the unrounded mantissa value results from a 1's complement operation;

normalizing the unrounded mantissa value to generate a normalized unrounded mantissa value, the normalizing in parallel with generating: a sticky bit associated with the unrounded mantissa value, wherein the sticky bit comprises an OR reduction of bits in the unrounded value that are less-significant than the round bit and a previous sticky bit; and a ones bit associated with the unrounded mantissa value, wherein the ones bit comprises an AND reduction of the bits in the unrounded mantissa value that are less-significant than the round bit and a previous ones bit;

incrementing, by a second incrementor, the normalized unrounded mantissa value to provide an incremented value, wherein the normalized unrounded mantissa value is a non-incremented value; and providing, by a second multiplexor, one of the incremented value and a non-incremented value as a rounded mantissa value responsive to the 2's complement signal and to the round bit.

2. The method of claim 1, wherein responsive to receiving an indication of a round to nearest, ties to even (RNE) rounding mode, the method further comprises:

providing the incremented value as the rounded mantissa value responsive to a logical expression:

(round||partial_2s_comp) && (LSB||
(sticky && ~(partial_2s_comp && ~round)
being true; and providing the non-incremented value as the rounded mantissa value responsive to the logical expression not being true;

wherein "round" is the round bit, wherein "partial_2s_comp" comprises (2s_comp && all_ones), wherein "2s_comp" is the 2's complement signal, wherein "all_ones" is the ones bit, wherein "LSB" is a least-significant bit of the unrounded mantissa value, and wherein "sticky" is the sticky bit.

3. The method of claim 1, wherein responsive to receiving an indication of a round to zero (RD) rounding mode, the method further comprises:

providing the incremented value as the rounded mantissa value responsive to a logical expression:

(2s_comp && all_ones && round)

being true; and providing the non-incremented value as the rounded mantissa value responsive to the logical expression not being true;

wherein "2s_comp" is the 2's complement signal, wherein "all_ones" is the ones bit, and wherein "round" is the round bit.

4. The method of claim 1, wherein responsive to receiving an indication of a round towards positive infinity (RPI) rounding mode, the method further comprises:

providing the incremented value as the rounded mantissa value responsive to a logical expression:

(~sign||complete_2s_comp) && (round||sticky)

being true; and providing the non-incremented value as the rounded mantissa value responsive to the logical expression not being true;

wherein "sign" is a sign bit associated with the unrounded mantissa value, wherein "round" is the round bit, wherein "complete_2s_comp" comprises (2s_comp && all_ones && round), wherein "2s_comp" is the 2's complement signal, wherein "all_ones" is the ones bit, and wherein "sticky" is the sticky bit.

5. The method of claim 1, wherein responsive to receiving an indication of a round towards negative infinity (RNI) rounding mode, the method further comprises:

providing the incremented value as the rounded mantissa value responsive to a logical expression:

(sign||complete_2s_comp) && (round||sticky)

being true; and providing the non-incremented value as the rounded mantissa value responsive to the logical expression not being true;

wherein "sign" is a sign bit associated with the unrounded mantissa value, wherein "round" is the round bit, wherein "complete_2s_comp" comprises (2s_comp && all_ones && round), wherein "2s_comp" is the 2's complement signal, wherein "all_ones" is the ones bit, and wherein "sticky" is the sticky bit.

6. The method of claim 1, wherein responsive to receiving an indication of a round to nearest, ties to max magnitude (RMM) rounding mode, the method further comprises:

providing the incremented value as the rounded mantissa value responsive to a logical expression:

(round||partial_2s_comp)

being true; and providing the non-incremented value as the rounded mantissa value responsive to the logical expression not being true;

wherein "round" is the round bit, wherein "partial_2s_comp" comprises (2s_comp && all_ones), wherein "2s_comp" is the 2's complement signal, and wherein "all ones" is the ones bit.

7. A system, comprising:

a normalizer configured to:

receive an unnormalized, unrounded mantissa value;

provide, responsive to the unnormalized, unrounded mantissa value and a shift signal, a normalized, unrounded mantissa value, and provide, responsive to the unnormalized, unrounded mantissa value, a round bit;

provide a sticky bit that comprises an OR reduction of bits in the unnormalized, unrounded mantissa value that are less-significant than the round bit based on an inverse of the shift signal; and provide a ones bit that comprises an AND reduction of bits in the unnormalized, unrounded mantissa value that are less-significant than the round bit based on the shift signal; and a rounding unit coupled to the normalizer, the rounding unit comprising:

an incrementor configured to increment the normalized, unrounded mantissa value to provide an incremented value, wherein the normalized, unrounded mantissa value is a non-incremented value;

a rounding select circuit configured to:

receive the round bit;

receive a 2's complement signal that indicates whether the unrounded mantissa value results from a 1's complement operation; and provide a rounding output responsive to the 2's complement signal; and a multiplexor (mux) coupled to the incrementor and the rounding select circuit, the mux configured to:

receive the incremented value and the non-incremented value as inputs;

receive the rounding output as a control signal; and provide one of the incremented value or non-incremented value as a rounded mantissa value responsive to the rounding output.

8. The system of claim 7, wherein, responsive to receiving an indication of a round to nearest, ties to even (RNE) rounding mode, the rounding select circuit is configured to provide the rounding output equal to a result of the logical expression:

(round||partial_2s_comp) && (LSB||(sticky && ~(partial_2s_comp && ~round)));

wherein the mux is configured to provide the incremented value as the rounded mantissa value responsive to the rounding output being asserted, and to provide the non-incremented value as the rounded mantissa value responsive to the rounding output being de-asserted;

wherein "round" is the round bit, wherein "partial_2s_comp" comprises (2s_comp && all_ones), wherein "2s_comp" is the 2's complement signal, wherein "all_ones" is the ones bit, wherein "LSB" is a least-significant bit of the normalized, unrounded mantissa value, and wherein "sticky" is the sticky bit.

9. The system of claim 7, wherein, responsive to receiving an indication of a round to zero (RD) rounding mode, the rounding select circuit is configured to provide the rounding output equal to a result of the logical expression:

(2s_comp && all_ones && round);

wherein the mux is configured to provide the incremented value as the rounded mantissa value responsive to the rounding output being asserted, and to provide the non-incremented value as the rounded mantissa value responsive to the rounding output being de-asserted;

wherein "2s_comp" is the 2's complement signal, wherein "all_ones" is the ones bit, and wherein "round" is the round bit.

10. The system of claim 7, wherein, responsive to receiving an indication of a round towards positive infinity (RPI) rounding mode, the rounding select circuit is configured to provide the rounding output equal to a result of the logical expression:

(~sign||complete_2s_comp) && (round||sticky);

wherein the mux is configured to provide the incremented value as the rounded mantissa value responsive to the rounding output being asserted, and to provide the non-incremented value as the rounded mantissa value responsive to the rounding output being de-asserted;

wherein "sign" is a sign bit associated with the unrounded mantissa value, wherein "round" is the round bit, wherein "complete_2s_comp" comprises (2s_comp && all_ones && round), wherein "2s_comp" is the 2's complement signal, wherein "all_ones" is the ones bit, and wherein "sticky" is the sticky bit.

11. The system of claim 7, wherein, responsive to receiving an indication of a round towards negative infinity (RNI) rounding mode, the rounding select circuit is configured to provide the rounding output equal to a result of the logical expression:

(sign||complete_2s_comp) && (round||sticky);

wherein the mux is configured to provide the incremented value as the rounded mantissa value responsive to the rounding output being asserted, and to provide the non-incremented value as the rounded mantissa value responsive to the rounding output being de-asserted;

wherein "sign" is a sign bit associated with the unrounded mantissa value, wherein "round" is the round bit, wherein "complete_2s_comp" comprises (2s_comp && all_ones && round), wherein "2s_comp" is the 2's complement signal, wherein "all_ones" is the ones bit, and wherein "sticky" is the sticky bit.

12. The system of claim 7, wherein, responsive to receiving an indication of a round to nearest, ties to max magnitude (RMM) rounding mode, the rounding select circuit is configured to provide the rounding output equal to a result of the logical expression:

(round||partial_2s_comp);

wherein the mux is configured to provide the incremented value as the rounded mantissa value responsive to the rounding output being asserted, and to provide the non-incremented value as the rounded mantissa value responsive to the rounding output being de-asserted;

wherein "round" is the round bit, wherein "partial_2s_comp" comprises (2s_comp && all_ones), wherein "2s_comp" is the 2's complement signal, and wherein "all_ones" is the ones bit.

13. A method, comprising:

receiving, by a normalizer, an unnormalized, unrounded mantissa value;

providing, responsive to the unnormalized, unrounded mantissa value and a shift signal, a normalized, unrounded mantissa value, and provide, responsive to the unnormalized, unrounded mantissa value, a round bit;

providing a sticky bit that comprises an OR reduction of bits in the unnormalized, unrounded mantissa value that are less-significant than the round bit based on an inverse of the shift signal;

providing a ones bit that comprises an AND reduction of bits in the unnormalized, unrounded mantissa value that are less-significant than the round bit based on the shift signal;

incrementing, by an incrementor, the normalized, unrounded mantissa value to provide an incremented value, wherein the normalized, unrounded mantissa value is a non-incremented value;

receiving, by a rounding select circuit, the round bit;

receiving a 2's complement signal that indicates whether the unrounded mantissa value results from a 1's complement operation;

providing a rounding output responsive to the 2's complement signal;

receiving, by a multiplexer, the incremented value and the non-incremented value as inputs;

receiving the rounding output as a control signal; and providing one of the incremented value or non-incremented value as a rounded mantissa value responsive to the rounding output.

14. The method of claim 13, wherein:

responsive to receiving an indication of a round to nearest, ties to even (RNE) rounding mode, providing, by the rounding select circuit, the rounding output equal to a result of the logical expression: (round II partial_2s_comp) && (LSB||(sticky && ~(partial_2s_comp && ~round))); and providing, by the mux, the incremented value as the rounded mantissa value responsive to the rounding output being asserted, and to provide the non-incremented value as the rounded mantissa value responsive to the rounding output being de-asserted;

wherein "round" is the round bit, wherein "partial_2s_comp" comprises (2s_comp && all_ones), wherein "2s_comp" is the 2's complement signal, wherein "all_ones" is the ones bit, wherein "LSB" is a least-significant bit of the normalized, unrounded mantissa value, and wherein "sticky" is the sticky bit.

15. The method of claim 13, wherein, responsive to receiving an indication of a round to zero (RD) rounding mode, the method further comprises providing, by the rounding select circuit, the rounding output equal to a result of the logical expression:

(2s_comp && all_ones && round);

wherein the mux is configured to provide the incremented value as the rounded mantissa value responsive to the rounding output being asserted, and to provide the non-incremented value as the rounded mantissa value responsive to the rounding output being de-asserted;

wherein "2s_comp" is the 2's complement signal, wherein "all ones" is the ones bit, and wherein "round" is the round bit.

16. The method of claim 13, wherein, responsive to receiving an indication of a round towards positive infinity (RPI) rounding mode, the method further comprises providing, by the rounding select circuit, the rounding output equal to a result of the logical expression:

(~sign||complete_2s_comp) && (round||sticky);

wherein the mux is configured to provide the incremented value as the rounded mantissa value responsive to the rounding output being asserted, and to provide the non-incremented value as the rounded mantissa value responsive to the rounding output being de-asserted;

wherein "sign" is a sign bit associated with the unrounded mantissa value, wherein "round" is the round bit, wherein "complete_2s_comp" comprises (2s_comp && all_ones && round), wherein "2s_comp" is the 2's complement signal, wherein "all_ones" is the ones bit, and wherein "sticky" is the sticky bit.

17. The method of claim 13, wherein, responsive to receiving an indication of a round towards negative infinity (RNI) rounding mode, the method further comprises providing, by the rounding select circuit, the rounding output equal to a result of the logical expression:

(sign||complete_2s_comp) && (round||sticky);

wherein the mux is configured to provide the incremented value as the rounded mantissa value responsive to the rounding output being asserted, and to provide the non-incremented value as the rounded mantissa value responsive to the rounding output being de-asserted;

wherein "sign" is a sign bit associated with the unrounded mantissa value, wherein "round" is the round bit, wherein "complete_2s_comp" comprises (2s_comp && all_ones && round), wherein "2s_comp" is the 2's complement signal, wherein "all ones" is the ones bit, and wherein "sticky" is the sticky bit.

18. The method of claim 13, wherein, responsive to receiving an indication of a round to nearest, ties to max magnitude (RMM) rounding mode, the method further comprises providing, by the rounding select circuit, the rounding output equal to a result of the logical expression:

(round||partial_2s_comp);

wherein the mux is configured to provide the incremented value as the rounded mantissa value responsive to the rounding output being asserted, and to provide the non-incremented value as the rounded mantissa value responsive to the rounding output being de-asserted;

wherein "round" is the round bit, wherein "partial_2s_comp" comprises (2s_comp && all_ones), wherein "2s_comp" is the 2's complement signal, and wherein "all_ones" is the ones bit.

* * * * *